(12) United States Patent
Kimura

(10) Patent No.: US 12,205,548 B2
(45) Date of Patent: Jan. 21, 2025

(54) DISPLAY CONTROL DEVICE, DISPLAY DEVICE, AND DISPLAY CONTROL METHOD

(71) Applicant: SONY GROUP CORPORATION, Tokyo (JP)

(72) Inventor: Kei Kimura, Tokyo (JP)

(73) Assignee: SONY GROUP CORPORATION, Tokyo (JP)

(*) Notice: Subject to any disclaimer, the term of this patent is extended or adjusted under 35 U.S.C. 154(b) by 0 days.

(21) Appl. No.: 18/546,379

(22) PCT Filed: Jan. 31, 2022

(86) PCT No.: PCT/JP2022/003478
§ 371 (c)(1),
(2) Date: Aug. 14, 2023

(87) PCT Pub. No.: WO2022/181212
PCT Pub. Date: Sep. 1, 2022

(65) Prior Publication Data
US 2024/0135881 A1    Apr. 25, 2024
US 2024/0233643 A9    Jul. 11, 2024

(30) Foreign Application Priority Data
Feb. 26, 2021  (JP) ................... 2021-029790

(51) Int. Cl.
G09G 3/3233  (2016.01)
(52) U.S. Cl.
CPC ... G09G 3/3233 (2013.01); *G09G 2300/0852* (2013.01); *G09G 2300/0861* (2013.01);
(Continued)

(58) Field of Classification Search
CPC ......... G09G 3/3233; G09G 2300/0852; G09G 2300/0861; G09G 2310/0213;
(Continued)

(56) References Cited

U.S. PATENT DOCUMENTS

2006/0007094 A1* 1/2006 Kang ................... G09G 3/3614
345/98
2019/0005884 A1* 1/2019 Yoo ......................... G06F 3/011

FOREIGN PATENT DOCUMENTS

JP          09-6278 A      1/1997
JP          09-9253 A      1/1997
(Continued)

OTHER PUBLICATIONS

International Search Report and Written Opinion of PCT Application No. PCT/JP2022/003478, issued on Apr. 19, 2022, 12 pages of ISRWO.

*Primary Examiner* — Stephen G Sherman
(74) *Attorney, Agent, or Firm* — CHIP LAW GROUP

(57) ABSTRACT

Provided are a display control device, a display device, and a display control method that enable light-emitting elements to emit light in units of a plurality of rows. A display control device controls a display device including at least a display array unit including a plurality of gate lines and a plurality of data lines that are disposed in a screen, and a plurality of light-emitting elements that is disposed at each of intersections of the gate lines and the data lines, and is selectively driven via the gate lines and the data lines, and a first drive circuit including a conversion unit capable of generating information for selecting, from among the plurality of gate lines, a plurality of gate lines on the basis of a selection signal that selects a row, the first drive circuit selecting, from among the plurality of gate lines, one or a plurality of gate lines on the basis of the information, the display control device including a signal generation unit that generates the (Continued)

selection signal that selects, from among the plurality of gate lines, a plurality of gate lines, and an output unit that outputs the selection signal.

18 Claims, 15 Drawing Sheets

(52) U.S. Cl.
CPC ............... *G09G 2310/0213* (2013.01); *G09G 2310/0243* (2013.01); *G09G 2320/0247* (2013.01)

(58) Field of Classification Search
CPC ... G09G 2310/0243; G09G 2320/0247; G09G 3/3225; G09G 3/20; G09G 3/3266; H10K 59/131
See application file for complete search history.

(56) References Cited

FOREIGN PATENT DOCUMENTS

| | | | |
|---|---|---|---|
| JP | 2005-156697 | A | 6/2005 |
| JP | 2019-012258 | A | 1/2019 |
| JP | 2019-507380 | A | 3/2019 |
| JP | 6622279 | A | 12/2019 |
| JP | 2020-060765 | A | 4/2020 |

\* cited by examiner

| a3 | a2 | a1 | a0 | Mask0 | y0 | y1 | y2 | y3 | y4 | y5 | y6 | y7 | y8 | y9 | y10 | y11 | y12 | y13 | y14 | y15 |
|---|---|---|---|---|---|---|---|---|---|---|---|---|---|---|---|---|---|---|---|---|
| 0 | 0 | 0 | 0 | 0 | 1 | 0 | 0 | 0 | 0 | 0 | 0 | 0 | 0 | 0 | 0 | 0 | 0 | 0 | 0 | 0 |
| 0 | 0 | 0 | 1 | 0 | 0 | 1 | 0 | 0 | 0 | 0 | 0 | 0 | 0 | 0 | 0 | 0 | 0 | 0 | 0 | 0 |
| 0 | 0 | 1 | 0 | 0 | 0 | 0 | 1 | 0 | 0 | 0 | 0 | 0 | 0 | 0 | 0 | 0 | 0 | 0 | 0 | 0 |
| 0 | 0 | 1 | 1 | 0 | 0 | 0 | 0 | 1 | 0 | 0 | 0 | 0 | 0 | 0 | 0 | 0 | 0 | 0 | 0 | 0 |
| 0 | 1 | 0 | 0 | 0 | 0 | 0 | 0 | 0 | 1 | 0 | 0 | 0 | 0 | 0 | 0 | 0 | 0 | 0 | 0 | 0 |
| 0 | 1 | 0 | 1 | 0 | 0 | 0 | 0 | 0 | 0 | 1 | 0 | 0 | 0 | 0 | 0 | 0 | 0 | 0 | 0 | 0 |
| 0 | 1 | 1 | 0 | 0 | 0 | 0 | 0 | 0 | 0 | 0 | 1 | 0 | 0 | 0 | 0 | 0 | 0 | 0 | 0 | 0 |
| 0 | 1 | 1 | 1 | 0 | 0 | 0 | 0 | 0 | 0 | 0 | 0 | 1 | 0 | 0 | 0 | 0 | 0 | 0 | 0 | 0 |
| 1 | 0 | 0 | 0 | 0 | 0 | 0 | 0 | 0 | 0 | 0 | 0 | 0 | 1 | 0 | 0 | 0 | 0 | 0 | 0 | 0 |
| 1 | 0 | 0 | 1 | 0 | 0 | 0 | 0 | 0 | 0 | 0 | 0 | 0 | 0 | 1 | 0 | 0 | 0 | 0 | 0 | 0 |
| 1 | 0 | 1 | 0 | 0 | 0 | 0 | 0 | 0 | 0 | 0 | 0 | 0 | 0 | 0 | 1 | 0 | 0 | 0 | 0 | 0 |
| 1 | 0 | 1 | 1 | 0 | 0 | 0 | 0 | 0 | 0 | 0 | 0 | 0 | 0 | 0 | 0 | 1 | 0 | 0 | 0 | 0 |
| 1 | 1 | 0 | 0 | 0 | 0 | 0 | 0 | 0 | 0 | 0 | 0 | 0 | 0 | 0 | 0 | 0 | 1 | 0 | 0 | 0 |
| 1 | 1 | 0 | 1 | 0 | 0 | 0 | 0 | 0 | 0 | 0 | 0 | 0 | 0 | 0 | 0 | 0 | 0 | 1 | 0 | 0 |
| 1 | 1 | 1 | 0 | 0 | 0 | 0 | 0 | 0 | 0 | 0 | 0 | 0 | 0 | 0 | 0 | 0 | 0 | 0 | 1 | 0 |
| 1 | 1 | 1 | 1 | 0 | 0 | 0 | 0 | 0 | 0 | 0 | 0 | 0 | 0 | 0 | 0 | 0 | 0 | 0 | 0 | 1 |
| 0 | 0 | 0 | x | 1 | 1 | 1 | 0 | 0 | 0 | 0 | 0 | 0 | 0 | 0 | 0 | 0 | 0 | 0 | 0 | 0 |
| 0 | 0 | 1 | x | 1 | 0 | 0 | 1 | 1 | 0 | 0 | 0 | 0 | 0 | 0 | 0 | 0 | 0 | 0 | 0 | 0 |
| 0 | 1 | 0 | x | 1 | 0 | 0 | 0 | 0 | 1 | 1 | 0 | 0 | 0 | 0 | 0 | 0 | 0 | 0 | 0 | 0 |
| 0 | 1 | 1 | x | 1 | 0 | 0 | 0 | 0 | 0 | 0 | 1 | 1 | 0 | 0 | 0 | 0 | 0 | 0 | 0 | 0 |
| 1 | 0 | 0 | x | 1 | 0 | 0 | 0 | 0 | 0 | 0 | 0 | 0 | 1 | 1 | 0 | 0 | 0 | 0 | 0 | 0 |
| 1 | 0 | 1 | x | 1 | 0 | 0 | 0 | 0 | 0 | 0 | 0 | 0 | 0 | 0 | 1 | 1 | 0 | 0 | 0 | 0 |
| 1 | 1 | 0 | x | 1 | 0 | 0 | 0 | 0 | 0 | 0 | 0 | 0 | 0 | 0 | 0 | 0 | 1 | 1 | 0 | 0 |
| 1 | 1 | 1 | x | 1 | 0 | 0 | 0 | 0 | 0 | 0 | 0 | 0 | 0 | 0 | 0 | 0 | 0 | 0 | 1 | 1 |

FIG. 17

| _____210_____ | | | | | | _____212_____ | | | | | | | | | | | | | | | |
|---|---|---|---|---|---|---|---|---|---|---|---|---|---|---|---|---|---|---|---|---|---|
| Input | | | | | | Row Select | | | | | | | | | | | | | | | |
| a3 | a2 | a1 | a0 | Mask1 | Mask0 | y0 | y1 | y2 | y3 | y4 | y5 | y6 | y7 | y8 | y9 | y10 | y11 | y12 | y13 | y14 | y15 |
| 0 | 0 | 0 | 0 | 0 | 0 | 1 | 0 | 0 | 0 | 0 | 0 | 0 | 0 | 0 | 0 | 0 | 0 | 0 | 0 | 0 | 0 |
| 0 | 0 | 0 | 1 | 0 | 0 | 0 | 1 | 0 | 0 | 0 | 0 | 0 | 0 | 0 | 0 | 0 | 0 | 0 | 0 | 0 | 0 |
| 0 | 0 | 1 | 0 | 0 | 0 | 0 | 0 | 1 | 0 | 0 | 0 | 0 | 0 | 0 | 0 | 0 | 0 | 0 | 0 | 0 | 0 |
| 0 | 0 | 1 | 1 | 0 | 0 | 0 | 0 | 0 | 1 | 0 | 0 | 0 | 0 | 0 | 0 | 0 | 0 | 0 | 0 | 0 | 0 |
| 0 | 1 | 0 | 0 | 0 | 0 | 0 | 0 | 0 | 0 | 1 | 0 | 0 | 0 | 0 | 0 | 0 | 0 | 0 | 0 | 0 | 0 |
| 0 | 1 | 0 | 1 | 0 | 0 | 0 | 0 | 0 | 0 | 0 | 1 | 0 | 0 | 0 | 0 | 0 | 0 | 0 | 0 | 0 | 0 |
| 0 | 1 | 1 | 0 | 0 | 0 | 0 | 0 | 0 | 0 | 0 | 0 | 1 | 0 | 0 | 0 | 0 | 0 | 0 | 0 | 0 | 0 |
| 0 | 1 | 1 | 1 | 0 | 0 | 0 | 0 | 0 | 0 | 0 | 0 | 0 | 1 | 0 | 0 | 0 | 0 | 0 | 0 | 0 | 0 |
| 1 | 0 | 0 | 0 | 0 | 0 | 0 | 0 | 0 | 0 | 0 | 0 | 0 | 0 | 1 | 0 | 0 | 0 | 0 | 0 | 0 | 0 |
| 1 | 0 | 0 | 1 | 0 | 0 | 0 | 0 | 0 | 0 | 0 | 0 | 0 | 0 | 0 | 1 | 0 | 0 | 0 | 0 | 0 | 0 |
| 1 | 0 | 1 | 0 | 0 | 0 | 0 | 0 | 0 | 0 | 0 | 0 | 0 | 0 | 0 | 0 | 1 | 0 | 0 | 0 | 0 | 0 |
| 1 | 0 | 1 | 1 | 0 | 0 | 0 | 0 | 0 | 0 | 0 | 0 | 0 | 0 | 0 | 0 | 0 | 1 | 0 | 0 | 0 | 0 |
| 1 | 1 | 0 | 0 | 0 | 0 | 0 | 0 | 0 | 0 | 0 | 0 | 0 | 0 | 0 | 0 | 0 | 0 | 1 | 0 | 0 | 0 |
| 1 | 1 | 0 | 1 | 0 | 0 | 0 | 0 | 0 | 0 | 0 | 0 | 0 | 0 | 0 | 0 | 0 | 0 | 0 | 1 | 0 | 0 |
| 1 | 1 | 1 | 0 | 0 | 0 | 0 | 0 | 0 | 0 | 0 | 0 | 0 | 0 | 0 | 0 | 0 | 0 | 0 | 0 | 1 | 0 |
| 1 | 1 | 1 | 1 | 0 | 0 | 0 | 0 | 0 | 0 | 0 | 0 | 0 | 0 | 0 | 0 | 0 | 0 | 0 | 0 | 0 | 1 |
| 0 | 0 | 0 | x | 0 | 1 | 1 | 1 | 0 | 0 | 0 | 0 | 0 | 0 | 0 | 0 | 0 | 0 | 0 | 0 | 0 | 0 |
| 0 | 0 | 1 | x | 0 | 1 | 0 | 0 | 1 | 1 | 0 | 0 | 0 | 0 | 0 | 0 | 0 | 0 | 0 | 0 | 0 | 0 |
| 0 | 1 | 0 | x | 0 | 1 | 0 | 0 | 0 | 0 | 1 | 1 | 0 | 0 | 0 | 0 | 0 | 0 | 0 | 0 | 0 | 0 |
| 0 | 1 | 1 | x | 0 | 1 | 0 | 0 | 0 | 0 | 0 | 0 | 1 | 1 | 0 | 0 | 0 | 0 | 0 | 0 | 0 | 0 |
| 1 | 0 | 0 | x | 0 | 1 | 0 | 0 | 0 | 0 | 0 | 0 | 0 | 0 | 1 | 1 | 0 | 0 | 0 | 0 | 0 | 0 |
| 1 | 0 | 1 | x | 0 | 1 | 0 | 0 | 0 | 0 | 0 | 0 | 0 | 0 | 0 | 0 | 1 | 1 | 0 | 0 | 0 | 0 |
| 1 | 1 | 0 | x | 0 | 1 | 0 | 0 | 0 | 0 | 0 | 0 | 0 | 0 | 0 | 0 | 0 | 0 | 1 | 1 | 0 | 0 |
| 1 | 1 | 1 | x | 0 | 1 | 0 | 0 | 0 | 0 | 0 | 0 | 0 | 0 | 0 | 0 | 0 | 0 | 0 | 0 | 1 | 1 |
| 0 | 0 | x | x | 1 | x | 1 | 1 | 1 | 1 | 0 | 0 | 0 | 0 | 0 | 0 | 0 | 0 | 0 | 0 | 0 | 0 |
| 0 | 1 | x | x | 1 | x | 0 | 0 | 0 | 0 | 1 | 1 | 1 | 1 | 0 | 0 | 0 | 0 | 0 | 0 | 0 | 0 |
| 1 | 0 | x | x | 1 | x | 0 | 0 | 0 | 0 | 0 | 0 | 0 | 0 | 1 | 1 | 1 | 1 | 0 | 0 | 0 | 0 |
| 1 | 1 | x | x | 1 | x | 0 | 0 | 0 | 0 | 0 | 0 | 0 | 0 | 0 | 0 | 0 | 0 | 1 | 1 | 1 | 1 |

DISPLAY CONTROL DEVICE, DISPLAY DEVICE, AND DISPLAY CONTROL METHOD

CROSS REFERENCE TO RELATED APPLICATIONS

This application is a U.S. National Phase of International Patent Application No. PCT/JP2022/003478 filed on Jan. 31, 2022, which claims priority benefit of Japanese Patent Application No. JP 2021-029790 filed in the Japan Patent Office on Feb. 26, 2021. Each of the above-referenced applications is hereby incorporated herein by reference in its entirety.

TECHNICAL FIELD

The present disclosure relates to a display control device, a display device, and a display control method.

BACKGROUND ART

A display device includes light-emitting elements arranged in a matrix. Such a display device generally includes a source driver and a gate driver. The gate driver brings light-emitting elements on a gate line selected from a plurality of gate lines into a conductive state, and performs line-sequential scanning on the light-emitting elements in units of rows.

However, even in a case where a region of interest is displayed, a display array unit of the display device is scanned row by row from a top to a bottom or from the bottom to the top in a line-sequential scanning method. Therefore, it takes time to display the region of interest.

CITATION LIST

Patent Document

Patent Document 1: Japanese Patent No. 6622279

SUMMARY OF THE INVENTION

Problems to be Solved by the Invention

Therefore, the present disclosure provides a display control device, a display device, and a display control method that enable light-emitting elements to emit light in units of a plurality of rows.

Solutions to Problems

In order to solve the problem described above, according to the present disclosure, there is provided a display control device that controls a display device including at least
a display array unit including a plurality of gate lines and a plurality of data lines that are disposed in a screen, and a plurality of light-emitting elements that is disposed at each of intersections of the gate lines and the data lines, and is selectively driven via the gate lines and the data lines, and a first drive circuit including a conversion unit capable of generating information for selecting, from among the plurality of gate lines, a plurality of gate lines on the basis of a selection signal that selects a row, the first drive circuit selecting, from among the plurality of gate lines, one or a plurality of gate lines on the basis of the information,
the display control device including
a signal generation unit that generates the selection signal that selects, from among the plurality of gate lines, a plurality of gate lines, and
an output unit that outputs the selection signal.

The signal generation unit may generate each of the selection signals corresponding to gate lines selected within one vertical period of the display array unit, and
the output unit may output the each the selection signals in time series.

The output unit may output the selection signals in order from a selection signal corresponding to a predetermined gate line.

The predetermined gate line may correspond to an inside of a region of interest in an image.

After outputting the selection signal corresponding to the predetermined gate line, the output unit may alternately output selection signals corresponding to gate lines positioned above and below the predetermined gate line.

The selection signal corresponding to a gate line in a first area, among the plurality of gate lines, may be a first selection signal that selects one row, and the selection signals corresponding to gate lines in a second area different from the first area may be second selection signals that select a plurality of rows.

After outputting the first selection signal corresponding to a sequence of the predetermined gate line, the output unit may alternately output the second selection signals corresponding to the gate lines positioned at an upper section and lower section of the second area.

The output unit may output the second selection signals after outputting the first selection signal.

The display control device further includes
a storage unit that stores image data, and
a recognition processing unit that recognizes a predetermined recognition region from the image data,
in which the signal generation unit may generate the first selection signal on the basis of the predetermined recognition region.

The display device may further include a second drive circuit that sequentially selects the plurality of data lines and supplies a video signal, and
the output unit may output the video signal on the basis of the image data.

The display control device may further include
a light emission control unit that causes the first drive circuit to select a plurality of gate lines disposed in the screen, and causes high-luminance signals to be output from the plurality of data lines in the second drive circuit.

The selection signal may include an address signal corresponding to a gate line selected from the plurality of gate lines, and
the conversion unit may convert, on the basis of the address signal, into information for selecting, from among the plurality of gate lines, one or a plurality of gate lines.

The address signal may include a high-order address signal and a low-order address signal, and, in a case where, from among the plurality of gate lines, a plurality of gate lines is selected, the first drive circuit may select the plurality of gate lines on the basis of the high-order address signal.

The selection signal may include a mask signal indicating that the low-order address signal is not to be used, and the first drive circuit may select, from among the plurality of gate lines, a plurality of gate lines on the basis of the mask signal.

According to the present disclosure, there is provided a display device including a display array unit including a plurality of gate lines and a plurality of data lines that are disposed in a screen, and a plurality of light-emitting elements that is disposed at each of intersections of the gate lines and the data lines, and is selectively driven via the gate lines and the data lines, a first drive circuit including an address decoder capable of generating information for selecting, from among the plurality of gate lines, a plurality of gate lines on the basis of an address signal that selects a row, the first drive circuit selecting, from among the plurality of gate lines, one or a plurality of gate lines on the basis of the information, and a second drive circuit that sequentially selects the plurality of data lines and supplies a video signal.

The address signal may include a high-order address signal and a low-order address signal, and, in a case where, from among the plurality of gate lines, a plurality of gate lines is selected, the first drive circuit may select the plurality of gate lines on the basis of the high-order address signal.

The first drive circuit may select, from the plurality of gate lines, a plurality of gate lines according to a mask signal indicating that the low-order address signal is not to be used.

According to the present disclosure, there is provided a display control method for controlling a display device including at least a display array unit including a plurality of gate lines and a plurality of data lines that are disposed in a screen, and a plurality of light-emitting elements that is disposed at each of intersections of the gate lines and the data lines, and is selectively driven via the gate lines and the data lines, and a first drive circuit including a conversion unit capable of generating information for selecting, from among the plurality of gate lines, a plurality of gate lines on the basis of a selection signal that selects a row, the first drive circuit selecting, from among the plurality of gate lines, one or a plurality of gate lines on the basis of the information, the display control method including a signal generation step of generating the selection signal that selects, from among the plurality of gate lines, a plurality of gate lines, and an output step of outputting the selection signal.

BRIEF DESCRIPTION OF DRAWINGS

FIG. 17 is a diagram illustrating an example of a truth table of the address decoder according to the fourth embodiment.

MODES FOR CARRYING OUT THE INVENTION

Hereinafter, embodiments of a display control device, display device, and display control method will be described with reference to the drawings. Although main components of the communication device and the communication system will be mainly described below, the communication device and the communication system may have components and functions that are not illustrated or described. The following description does not exclude components and functions that are not illustrated or described.

First Embodiment

Figure 1:
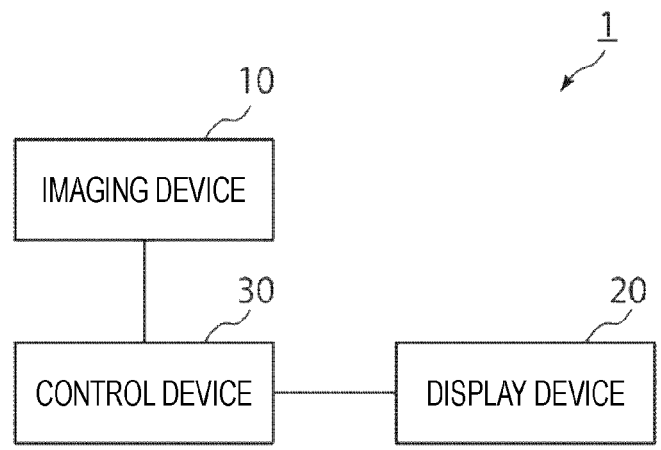
FIG. 1 is a diagram illustrating an example of a configuration of a display system 1 according to a first embodiment.

FIG. 1 is a diagram illustrating an example of a configuration of a display system 1 according to a first embodiment of the present technology. The display system 1 is a system capable of causing light-emitting elements to emit light in units of rows to display an image, and includes an imaging device 10, a display device 20, and a display control device 30.

The imaging device 10 is, for example, a camera, and can supply the display control device 30 with digital image data obtained by shooting a moving image.

The display device 20 is a device that can display an image by causing the light-emitting elements to emit light in units of rows by using a video signal based on digital image data. The display device 20 includes, for example, a current-driven light-emitting element. As the light-emitting element, an organic electroluminescent element, an LED element, a semiconductor laser element, or the like can be used. Furthermore, the display device 20 may have a so-called monochrome display configuration or a color display configuration. In a case where a color display configuration is employed, one color pixel can be configured including a plurality of pixels, specifically, one color pixel can be configured including a set of a red display pixel, a green display pixel, and a blue display pixel. Moreover, one color pixel can be configured including one set in which one or a plurality of types of pixels is further added to these three types of pixels. Note that a detailed configuration of the display device 20 will be described later.

The display control device 30 controls the display device 20 to display a video based on the digital image data. Furthermore, the digital image data may be supplied to the display control device 30 via a network, wireless communication, or the like. Alternatively, the digital image data may be supplied to the display control device 30 from a storage medium. Note that a detailed configuration of the display control device 30 will also be described later. Furthermore, in the present embodiment, the digital image data may be referred to as image data.

Figure 2:
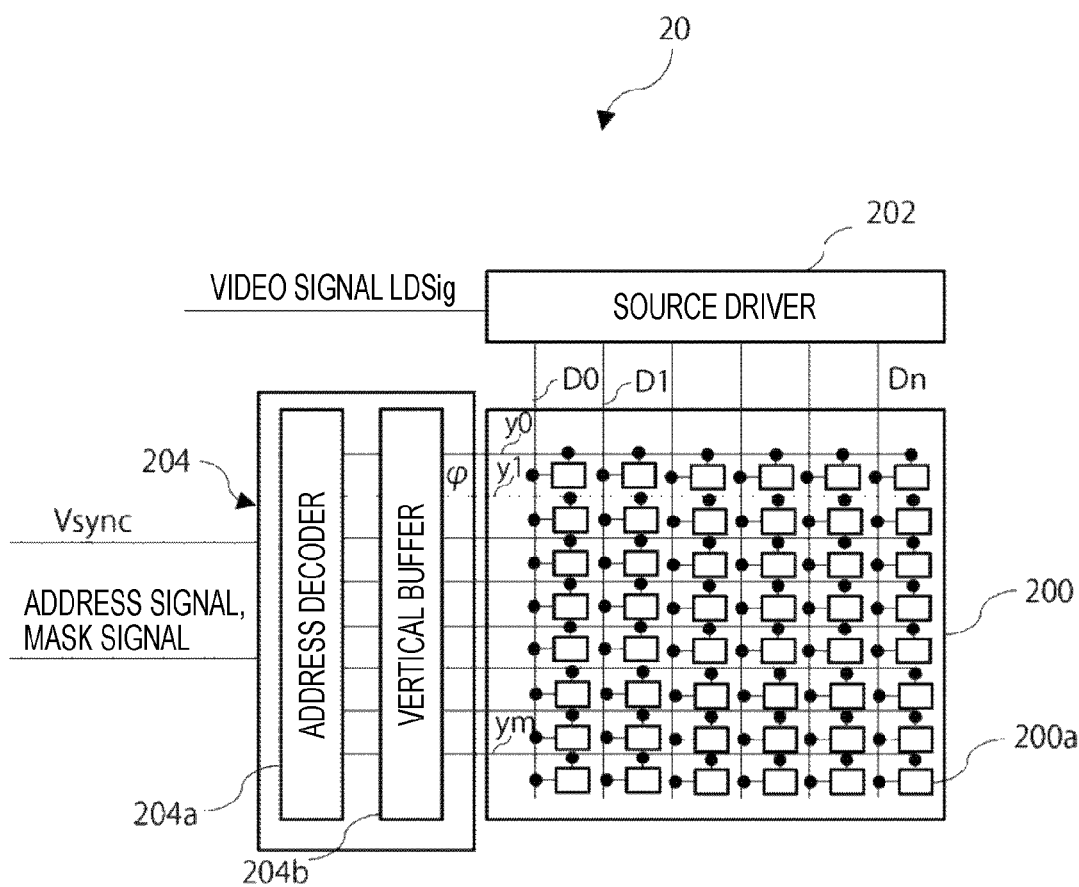
FIG. 2 is a block diagram illustrating an example of a configuration of a display device.

FIG. 2 is a block diagram illustrating an example of a configuration of the display device 20. As illustrated in FIG. 2, the display device 20 includes a display array unit 200, a source driver 202, and a gate driver 204. Furthermore, the gate driver 204 includes an address decoder 204a and a vertical buffer 204b.

In the display array unit 200, for example, m+1 number of pixels in a row direction and n+1 number of pixels in the column direction, a total of (m+1)×(n+1) number pixels 200a, are formed on a semiconductor substrate in which a semiconductor layer including silicon is formed on a substrate. That is, the display array unit 200 includes a plurality of gate lines y0 to ym and a plurality of data lines D0 to Dn disposed in a screen so as to be orthogonal to each other, and pixels 200a disposed at respective intersecting points of both the lines and selectively driven via the gate lines y0 to ym and the data lines D0 to Dn.

For example, a video signal LDSig representing gradation corresponding to an image to be displayed is input from the display control device 30 to the source driver 202. The video signal LDSig is, for example, a digital signal. The source driver 202 sequentially latches, for example, signals LDSig. With this arrangement, the signals LDSig are distributed to the respective data lines D0 to Dn and are sampled and input. Moreover, the source driver 202 performs digital-to-analog conversion processing on the respective video signals LDSig distributed to the data lines D0 to Dn, generates analog signals corresponding to gradation values of the video signals LDSig, and supplies the data lines D0 to Dn with the generated analog signals as video signals. Note that the source driver 202 according to the present embodiment corresponds to a second drive circuit.

The gate driver 204 applies a voltage φ as a gate signal to each of the gate lines y0 to ym. By this gate signals, the pixels 200a are scanned in units of rows, for example. More specifically, to a gate driver 202, for example, selection signals indicating a row to be scanned are input in time series from the display control device 30. Each of the selection signals includes, for example, address signals and a mask signal.

When a selection signal is input, on the basis of addresses included in the address signals and mask signal, and of the mask information, the address decoder 204a decodes the selection signal into a value of the row to be scanned. Furthermore, the address decoder 204a can select a plurality of rows simultaneously according to the address signals and the mask signal. With this arrangement, n+1 number of pixels 200a arranged on an L-th row selected and an (L+1)-th row (0≤L≤(m−1)) are driven. Note that a detailed configuration of the address decoder 204a will be described later. Furthermore, the gate driver 204 according to the present embodiment corresponds to a first drive circuit, and the address decoder 204a according to the present embodiment corresponds to a conversion unit.

The vertical buffer 204b applies the voltage φ as a gate signal to a row L to be scanned, the row L being input from the address decoder 204a. With this arrangement, the n+1 number of pixels 200a arranged on the L-th row are driven in synchronization with a vertical synchronization signal Vsync.

Figure 3:
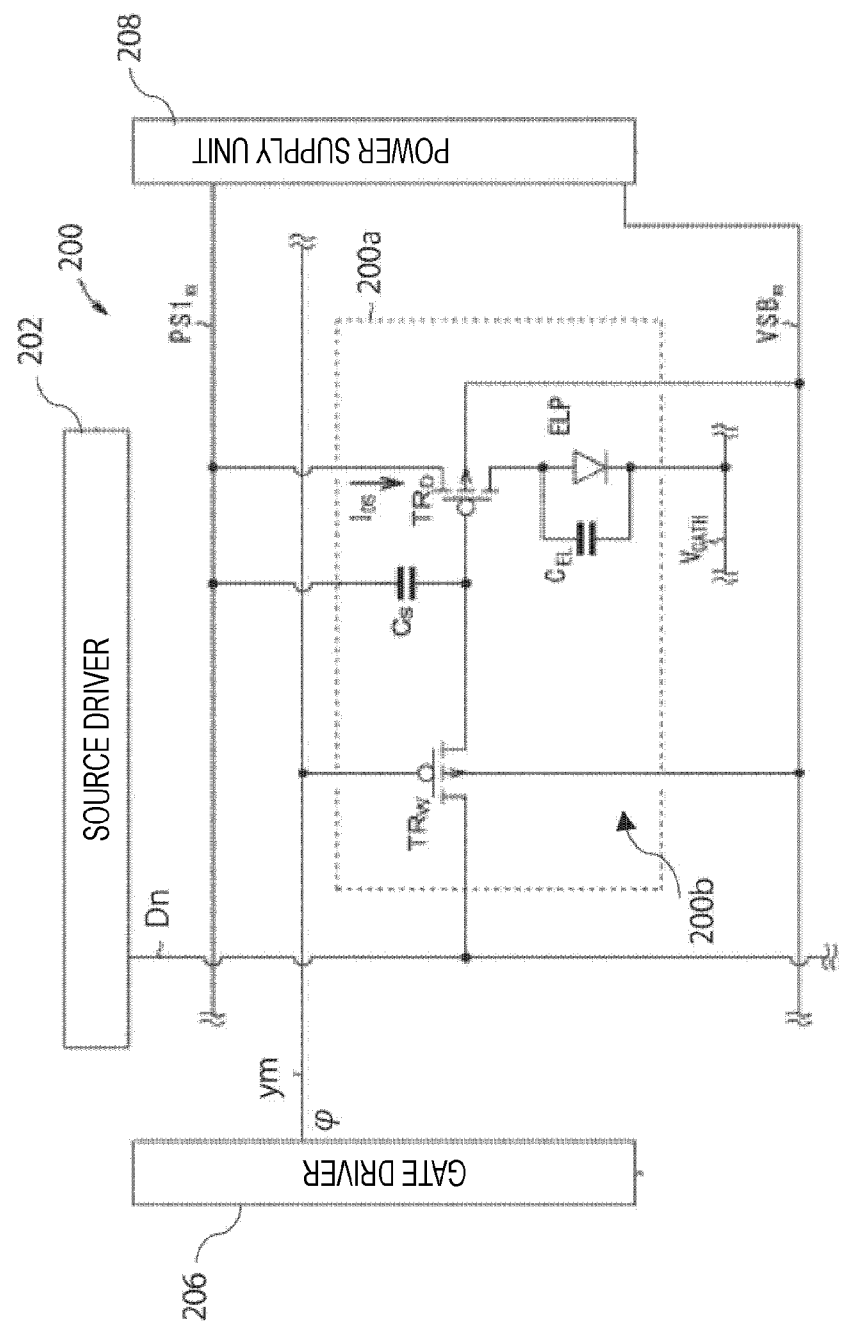
FIG. 3 is a schematic circuit diagram of a pixel (light-emitting element) including a light emission part and a drive circuit for driving the light emission part.

FIG. 3 is a schematic circuit diagram of a pixel (light-emitting element) 200a including a light emission part and a drive circuit for driving the light emission part. Note that, for convenience of illustration, FIG. 2 illustrates a wiring relation of one pixel 200a, more specifically, an (m, n)-th pixel 200a.

As illustrated in FIG. 3, a pixel 200a includes a light emission part ELP driven by current and a drive circuit 200b for driving the light emission part ELP. The drive circuit 200b includes at least a write transistor $TR_W$ for writing a video signal, and a drive transistor $TR_D$ for applying a current to the light emission part ELP. These transistors include a p-channel transistor.

The drive circuit 200b further includes a capacitor $C_S$. The capacitor $C_S$ is used to hold a voltage of a gate electrode with respect to a source region (so-called gate-source voltage) of the drive transistor $TR_D$. At a time of light emission of a pixel 70, one source/drain region (a side connected to a power supply line PS1n in FIG. 3) of the drive transistor $TR_D$ serves as a source region, and another source/drain region of the drive transistor $TR_D$ serves as a drain region.

One electrode and another electrode that constitute the capacitor $C_S$ are connected to the one source/drain region and gate electrode of the drive transistor $TR_D$, respectively. The another source/drain region of the drive transistor $TR_D$ is connected to an anode electrode of the light emission part ELP.

The light emission part ELP is a current-driven light emission part of which light emission luminance changes according to a value of flowing current, and specifically includes an organic electroluminescence light emission part. The light emission part ELP has a known configuration or structure including an anode electrode, a hole-transport layer, a light emission layer, an electron transport layer, a cathode electrode, or the like.

Another end (specifically, the cathode electrode) of the light emission part ELP is connected to a common power supply line. A predetermined voltage $V_{CATH}$ (for example, ground potential) is supplied to the common power supply line. The write transistor $TR_W$ includes a gate electrode connected to a scanning line ym, one source/drain region connected to a data line Dn, and another source/drain region connected to the gate electrode of the drive transistor $TR_D$. As a result, when the voltage φ is applied to the scanning line ym, a signal voltage from the data line Dn is written to the capacitor $C_S$ via the write transistor $TR_W$.

As described above, the capacitor $C_S$ is connected between the one source/drain region and gate electrode of the drive transistor $TR_D$. A power supply voltage VCC is applied from a power supply unit 208 (not illustrated in FIG. 2) to the one source/drain region of the drive transistor $TR_D$ via a power supply line PS1m. When a video signal voltage VSig from the data line Dn is written to the capacitor CS via the write transistor $TR_W$, the capacitor CS holds a voltage such as (VCC−VSig) as a gate-source voltage of the drive transistor TRD. A drain current Ids flows through the drive transistor TRD, and the light emission part ELP emits light with a luminance corresponding to a current value. Then, in the display device 20, a voltage is supplied to at least a back gate of the write transistor $TR_W$ via a back-gate wiring line VSBm provided separately from a power supply line PS1 that supplies a voltage to the drive transistor TRD. In the example illustrated in FIG. 3, a voltage is supplied to back gates of the write transistor TRW and drive transistor TRD via a back-gate wiring line VSB. With this arrangement, the voltage is supplied to the back gate of each transistor via a supply path that is different from a supply path for supplying voltage to the drive transistor TRD, in other words, a supply path independent of the supply path for supplying the voltage to the drive transistor TRD.

Figure 4:
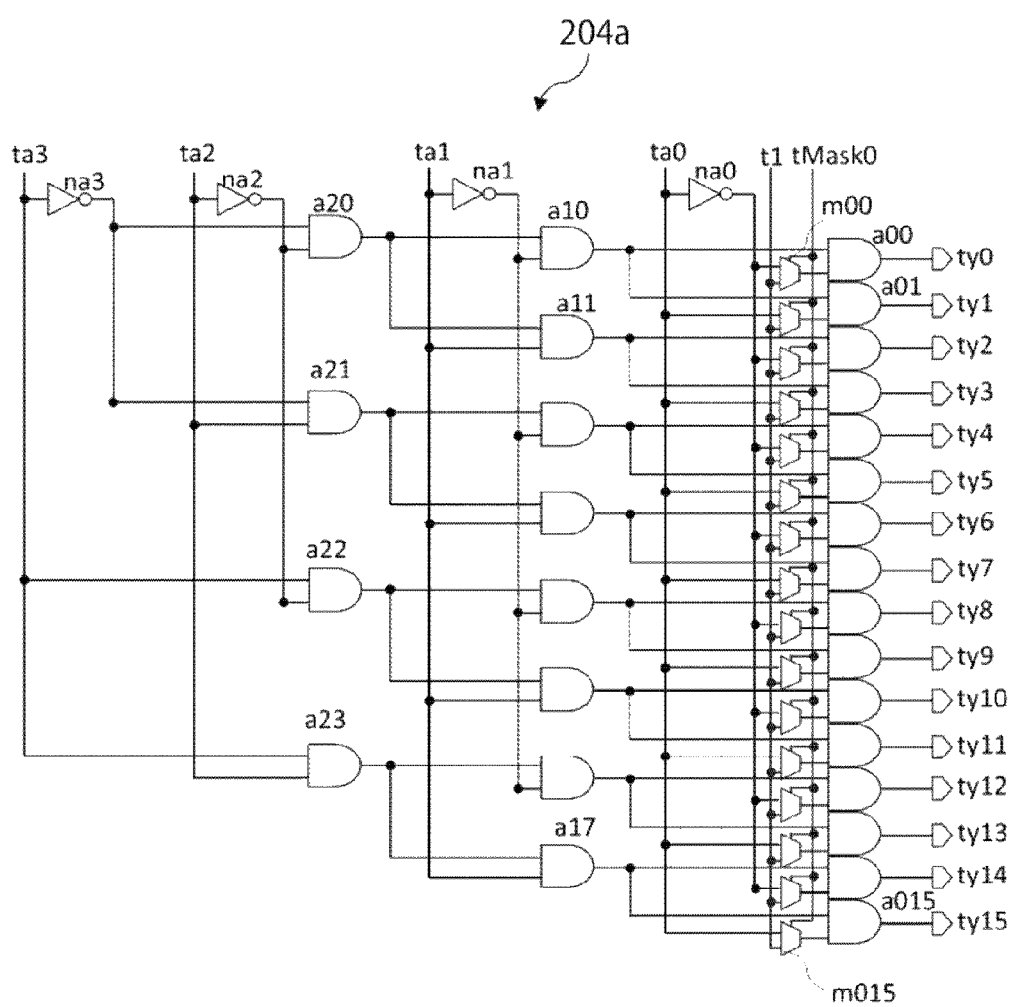
FIG. 4 is a block diagram illustrating an example of a configuration of an address decoder.

Here, examples of configuration and operation of the address decoder 204a will be described with reference to FIGS. 4 and 5. FIG. 4 is a block diagram illustrating an example of the configuration of the address decoder 204a.

As illustrated in FIG. 4, the address decoder 204a includes a plurality of NOT gates na0 to na3, a plurality of AND gates a20 to a23, a20 to a23, a10 to a17, and a00 to a015, and a plurality of multiplexers m00 to m015, input terminals ta0 to ta3, t1, tMask0, and output terminals ty0 to ty15. Note that 16 output terminals ty0 to ty15 are described to simplify the description, but the present invention is not limited thereto. For example, m may be set to 1024 to extend the number of the output terminals to 1024 or the like.

The terminal ta3 is connected to an input terminal of the NOT gate na3 and one input terminal of each of the AND gates a22 and 23. An output terminal of the NOT gate na3 is connected to one input terminal of each of the AND gates a20 and 21.

The terminal ta2 is connected to an input terminal of the NOT gate na2 and another input terminal of each of the AND gates a21 and 23. An output terminal of the NOT gate na2 is connected to another input terminal of each of the AND gates a20 and 22.

A terminal ta1 is connected to an input terminal of the NOT gate na2 and one input terminal of each of the AND gates a11, 13, 15, and 17 that are even-numbered AND gates from a top among the AND gates a10 to 17. An output terminal of the NOT gate na2 is connected to one input terminal of each of the AND gates a10, 12, 14, and 16 that are odd-numbered AND gates from the top among the AND gates a10 to 17.

Each of output terminals of the AND gates a20 to 23 is input to two each of another input terminals of the AND gates a10 to a17 from a top. Each of output terminals of the AND gates a10 to a17 is input to two each of one input terminals of each of the AND gates a00 to a015 from a top.

A terminal ta0 is connected to an input terminal of the NOT gate na0 and one input terminal of each of the multiplexers m01, m03, . . . m015 that are even-numbered multiplexers from a top among the multiplexers m00 to m015. An output terminal of the NOT gate na0 is connected to one input terminal of each of the multiplexers m00, m02, . . . m014 that are odd-numbered multiplexers from the top among the multiplexers m01, m03, . . . m015.

The terminal t1 is connected to another input terminal of each of the multiplexers m00 to m015. Output terminals of the multiplexers m00 to m015 are connected to the another input terminals of the AND gates a00 to a015. Furthermore, the terminal tMask0 is connected to a control terminal of each of the multiplexers m00 to m015. Then, output terminals of the AND gates a00 to a015 are connected to the output terminals ty0 to ty15, respectively. The address decoder 204a includes, for example, such logic gates, and performs, for example, operation illustrated in a truth table illustrated in FIG. 5. Note that the address decoder 204a according to the present embodiment includes logic gates, but is not limited thereto.

Figures 5, 6:
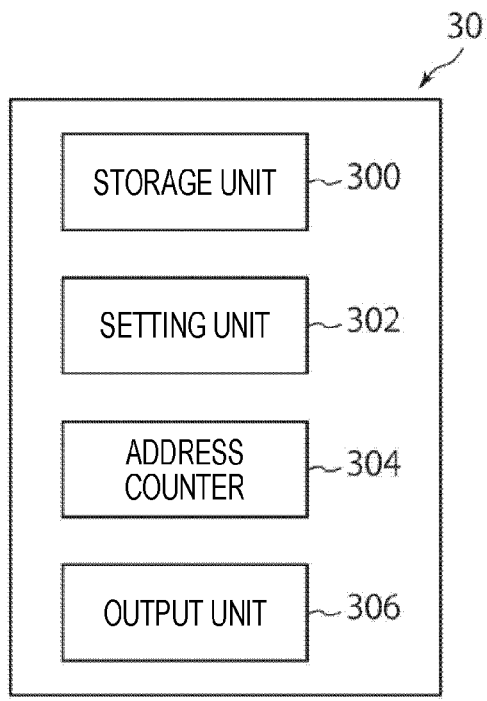
FIG. 5 is a diagram illustrating an example of a truth table of the address decoder.
FIG. 6 is a block diagram illustrating a configuration of a display control device.

FIG. 5 is a diagram illustrating an example of the truth table of the address decoder 204a. Bit data a3, a2, a1, and a0 in a field 210 are examples of the address signals, and bit data Mask0 is an example of the mask signal. As described above, the selection signal includes the address signals and the mask signal.

The bit data a3, a2, a1, and a0 are address signals input to the input terminals ta3, tat, tat, and ta0 (refer to FIG. 4), respectively, and the bit data Mask0 is a mask signal input to the input terminal tMask0 (refer to FIG. 4). The letters y0 to y15 in the field 212 represent bit data output from the address decoder 204a to the output terminals ty0 to ty15, respectively. Note that 1 is always input to the input terminal t1.

As can be seen from a combination of the logic gates in FIG. 4, for example, in a case where the address signals a3, a2, a1, and a0 are (0, 0, 0, 0) and a mask signal Mask0 is (0), the address decoder 204a outputs (1, 0, . . . 0) to the output terminals ty0 to ty15. Similarly, in a case where the address signals a3, a2, a1, and a0 are (0, 0, 0, 1) and Mask0 is (0), the address decoder 204a outputs (0, 1 . . . 0) to the output terminals ty0 to ty15. Similarly, in a case where the address signals a3, a2, a1, and a0 are (1, 1, 1, 1) and the mask signal Mask0 is (0), the address decoder 204a outputs (0, 0 . . . 1) to the output terminals ty0 to ty15.

Meanwhile, in a case where the mask signal Mask0 is (1), the address decoder 204a outputs a signal without depending on a value of the address signal a0. For example, in a case where the mask signal Mask0 is (1), the address signals a3, a2, a1, and a0 are (0, 0, 0, x), and (1, 1 . . . 0) is output to the output terminals ty0 to ty15. Here, "x" means not depending on a signal value x. Thus, the address signal includes high-order address signals (a3, a2, a1) and a low-order address signal (a0), and in a case where, from among the plurality of gate lines y0 to y15, a plurality of gate lines is selected, the gate driver 204 selects a plurality of gate lines on the basis of the high-order address signals.

For example, in a case where the mask signal Mask0 is (1), the address signals a3, a2, a1, and a0 are (0, 0, 1, x), and the address decoder 204a outputs (0, 0, 1, 1, 0 . . . 0) to the output terminals ty0 to ty15 on the basis of the high-order address signals (0, 0, 1). Thus, in a case where the mask signal Mask0 is (1), 1 is output to two consecutive terminals among the output terminals ty0 to ty15. With this arrangement, the gate lines y2, y3 are selected from among the plurality of gate lines y0 to y15. That is, the vertical buffer 204b applies the voltage φ as the gate signal to the gate lines y2 and y3.

On the basis of values of the output terminals ty0 to ty15 input from the address decoder 204a, the vertical buffer 204b applies the voltage φ as the gate signal to the row L to be scanned. For example, if the values of the output terminals ty0 to ty15 are (1, 0, . . . 0) in a case where the address signals a3, a2, a1, and a0 are (0, 0, 0, 0) and the mask signal Mask0 is (0), the voltage φ is applied as the gate signal to the gate line y0. With this arrangement, n+1 number of pixels 200a in a row 0 emit light according to the video signal.

Furthermore, for example, if the values of the output terminals ty0 to ty15 are (1, 1 . . . 0) in a case where the mask signal Mask0 is (1) and the address signals a3, a2, a1, and a0 are (0, 0, 0, x), the voltage φ is applied as the gate signal to the gate lines y0 and y1. With this arrangement, n+1 number of pixels 200a in respective rows 0 and 1 emit light according to the video signal.

FIG. 6 is a block diagram illustrating a configuration of the display control device 30. As illustrated in FIG. 6, the display control device 30 includes a storage unit 300, a setting unit 302, an address counter 304, and an output unit 305.

The storage unit 300 stores, for example, image data captured by the imaging device 10.

The setting unit 302 sets what number the row to be scanned is and a vertical resolution of the row to be scanned as control information. Furthermore, the setting unit 302 sets a display mode to be described later as control information. These settings can be set by an operator using an input unit (not illustrated).

On the basis of the control information set by the setting unit 302, the address counter 304 generates selection signals including address signals and a mask signal in time series.

The output unit 305 outputs the selection signals generated by the address counter 304 to the display device 20 in time series. Furthermore, in synchronization with the selection signals, the output unit 305 outputs, to the display device 20, a video signal based on an image data stored in the storage unit 300.

Figure 7:
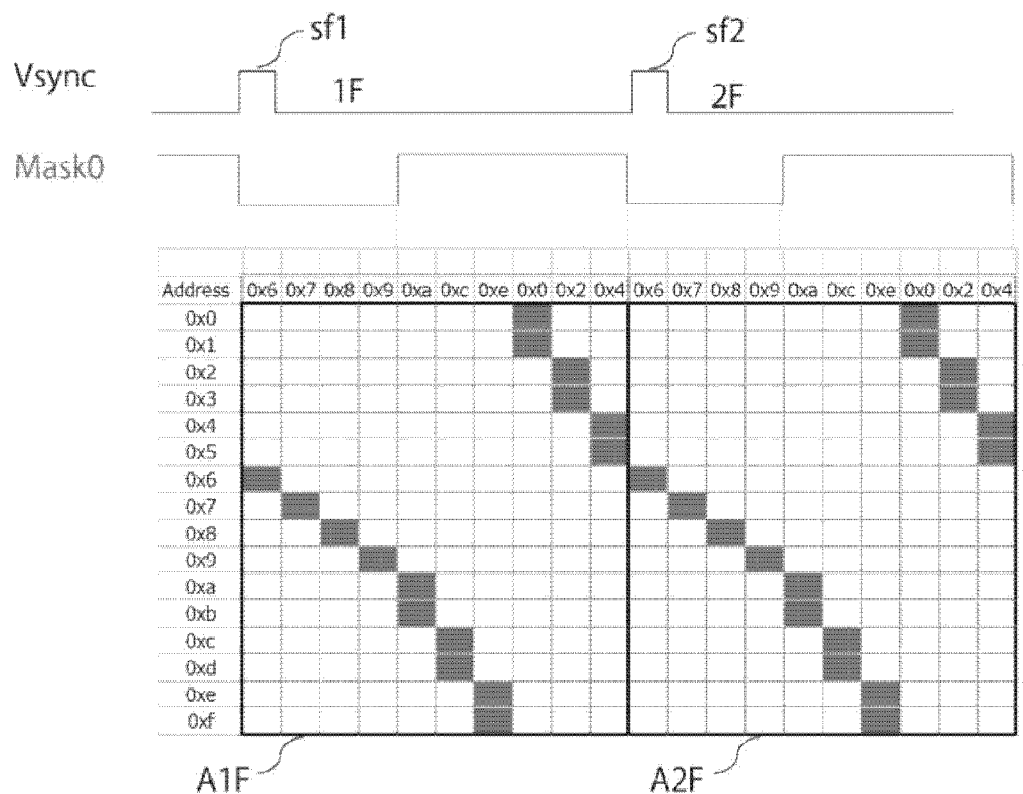
FIG. 7 is a schematic diagram illustrating an example of a setting by a setting unit.

FIG. 7 is a schematic diagram illustrating an example of a setting by the setting unit 302. FIG. 7 illustrates a horizontal synchronization signal Vsync and a mask signal Mask0. For the horizontal synchronization signal Vsync, the vertical axis represents a signal level and the horizontal axis represents an elapsed time. That is, a signal sf1 represents a synchronization start point of image data 1F of a first frame, and a signal sf2 represents a synchronization start point of image data 2F of a second frame.

For the mask signal Mask0, the vertical axis represents a signal level and the horizontal axis represents an elapsed time. A high level represents 1, and a low level represents 0.

An image A1F is an image indicating an order in which address signals are generated for the image data 1F, and an image A2F is an image indicating an order in which address signals are generated for the image data 2F. The vertical axis represents the address signals and the horizontal axis represents an elapsed time. For example, in the images A1F and A2F, the address signals correspond to the gate lines y0 to ym (FIG. 1) in order from the top. Here, in order to simplify the description, the address signals correspond to the gate lines y0 to y15.

In the image data 1F, the address signals are generated in an order of the address signals 0x6 to 0xF and 0x0 to 0x5, and it is indicated that, with the address signals 0x0 to 0x5 and 0xa to 0xf, the mask signal Mask0 is at a high level. In a case where generation of a plurality of address signals is instructed at the same time, the address counter 304 described later generates, for example, only a first signal of the address signals. For example, as illustrated in FIG. 7, in a case of the address signals 0xa and 0xb, only the address signal 0xa is generated.

According to the setting by the setting unit 302, the address counter 304 generates the horizontal synchronization signal Vsync, the mask signal Mask0, and the address signals on the basis of an internal clock. In the example in FIG. 7, according to a setting by the setting unit 302, the address counter 304 generates address signals in an order of the address signals 0x6, 0x7, 0x8, 0x9, 0xa, 0xc, 0xe, 0x0, 0x2, and 0x4, and outputs the address signals via the output unit 305. Note that the address counter 304 according to the present embodiment corresponds to a signal generation unit. Furthermore, the address counter 304 generates bit data in time series according to the set mask signal Mask0.

Furthermore, the address counter 304 synchronizes, from the storage unit 300, data on the row corresponding to the address signals with the address signals and the mask signal, and outputs the synchronized data as the video signal LDSig to the display device 20 via the output unit 305. For example, in the example in FIG. 7, according to the setting by the setting unit 302, the address counter 304 sequentially outputs, as the video signal LDSig, row data in the image data corresponding to the address signals 0x6, 0x7, 0x8, 0x9, 0xa, 0xc, 0xe, 0x0, 0x2, and 0x4 to the display device 20 via the output unit 305. For example, in a case where the mask signal Mask0 is at the high level, an address signal 0xa is output in a case of a combination of the address signals 0xa and 0xb, and therefore, image data of a row corresponding to the address signal 0xa is output as the video signal LDSig to the display device 20 via the output unit 305. As can be seen from the above description, in a case where the mask signal Mask0 is at the high level, an image resolution in a vertical direction of an image displayed on the display device 20 is halved.

Meanwhile, in a case where the mask signal Mask0 is at the high level, a time interval at which the address signals 0xa and 0xb are output via the output unit 305 is the same as a time interval at which the address signals 0x6, 0x7, 0x8, 0x9, and the like in a case here the mask signal is 0. Therefore, the longer a period during which the mask signal Mask0 is at the high level, the shorter a time during which the image data 1F for one frame is displayed. With this arrangement, in a moving image display, a time during which a region of interest is displayed can be relatively long.

Figure 8:
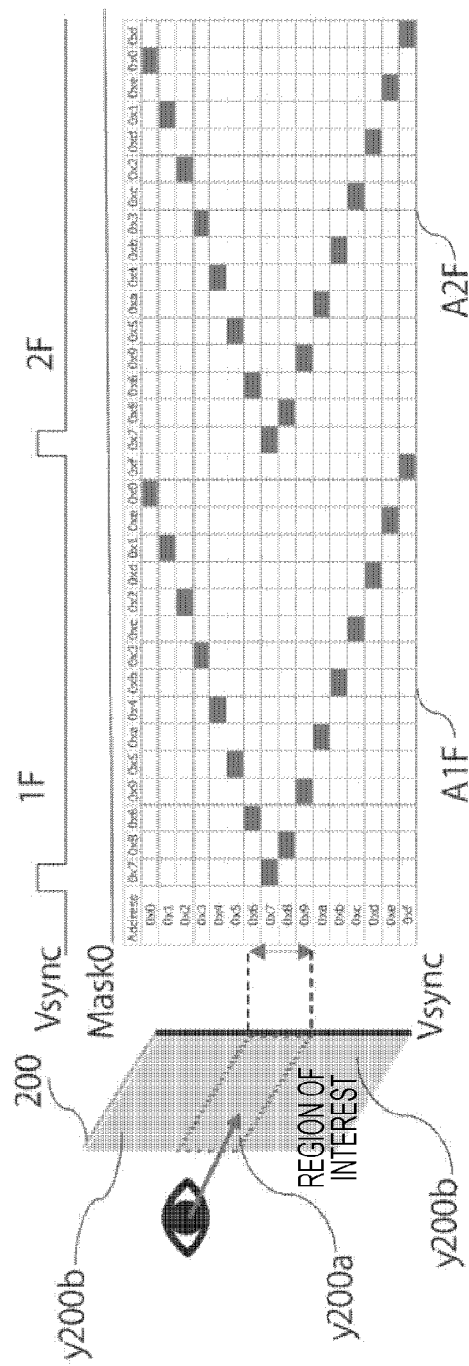
FIG. 8 is a diagram illustrating an example of a first mode in which an image is displayed in an upper direction and a lower direction alternately with respect to a region of interest.

Here, examples of display modes set by the setting unit 302 will be described with reference to FIGS. 8 to 10. FIG. 8 is a diagram illustrating an example of a first mode in which an image is displayed in an upper direction and a lower direction alternately with respect to the region of interest. The left figure schematically illustrates a display image by the display array unit 200 (refer to FIG. 2), and the right figure illustrates a horizontal synchronization signal Vsync, a mask signal Mask0, an image A1F, and an image A2F, similarly to FIG. 7. As illustrated in FIG. 8, the region of interest corresponds to a first area y200a of the plurality of gate lines y0 to ym in the display array unit 200 (refer to FIG. 2). Furthermore, an area other than the region of interest corresponds to a second area y200b among the plurality of gate lines y0 to ym. The output unit 305 alternately outputs selection signals corresponding to gate lines positioned above and below the gate lines for a central portion of the region of interest.

Thus, in the first mode, for example, the image is displayed in the upper direction and the lower direction alternately with respect to the central portion of the region of interest in the display array unit 200 (refer to FIG. 2). Therefore, in the first mode, the image data can be displayed in order from the central portion of the region of interest, and thus, the central portion of the region of interest can be observed first.

Figure 9:
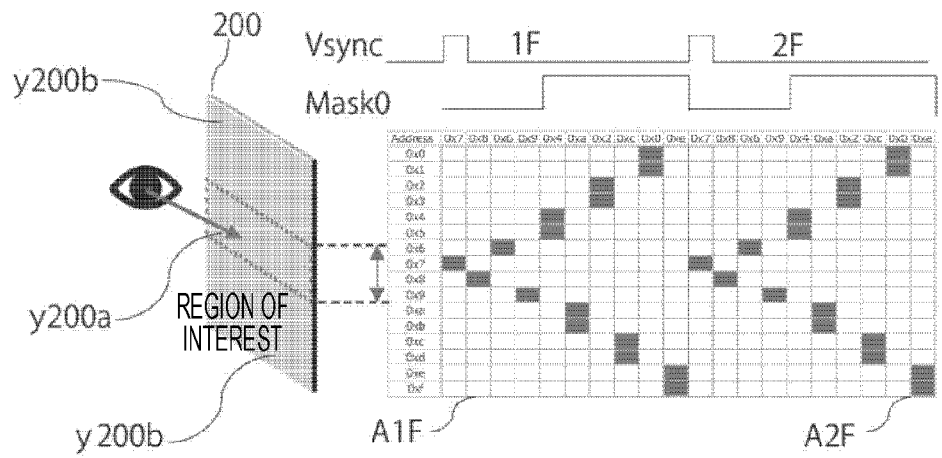
FIG. 9 is a diagram illustrating an example of the first mode in a case where there is a period during which a mask signal is in a high-level state.

FIG. 9 is a diagram illustrating an example of the first mode in a case where there is a period during which the mask signal Mask0 is in a high-level state. The left figure schematically illustrates a display image by the display array unit 200 (refer to FIG. 2), and the right figure illustrates a horizontal synchronization signal Vsync, a mask signal Mask0, an image A1F, and an image A2F, similarly to FIG. 7.

As illustrated in FIG. 9, the region of interest corresponds to the first area y200a in the plurality of gate lines y0 to ym in the display array unit 200 (refer to FIG. 2). The address counter 304 generates first selection signals, each of which is for selecting one row, as selection signals corresponding to the gate lines in the first area y200a. Furthermore, second selection signals, each of which is for selecting a plurality of rows, are generated as selection signals corresponding to gate lines in the second area y200b different from the first area y200a. Note that, in the present embodiment, a selection signal that selects one row is referred to as a first selection signal, and a selection signal that selects a plurality of rows is referred to as a second selection signal. That is, the mask signal Mask0 included in the first selection signal is at the low level (for example, 0), and the mask signal Mask0 included in the second selection signal is at the high level (for example, 1). As can be seen from the above description, the output unit 305 alternately outputs the first selection signals corresponding to the gate lines in the first area y200a in the up-down direction, and then alternately outputs the second selection signals corresponding to the gate lines positioned at an upper section and lower section of the second area y200b.

Thus, in the first mode, for example, the image is displayed in the upper direction and the lower direction alternately with respect to the region of interest in the display array unit 200 (refer to FIG. 2), and when the mask signal Mask0 is at the high level (for example, 1), a plurality of rows is simultaneously driven. With this arrangement, the region of interest can be observed first. Furthermore, because a time for displaying outside the region of interest can be shortened by the mask signal Mask0, a display time of a higher proportion can be used for display of the region of interest.

Figure 10:
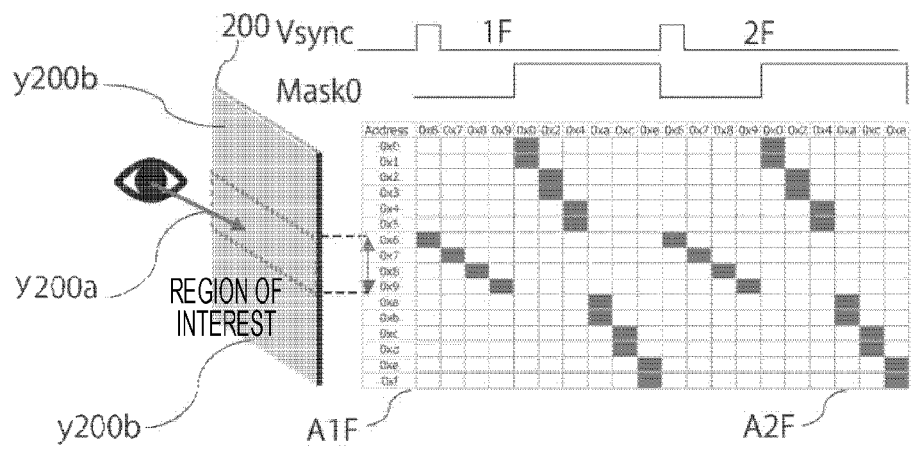
FIG. 10 is a diagram illustrating an example of a second mode in which the image is displayed in one direction in order from the region of interest.

FIG. 10 is a diagram illustrating an example of a second mode in which the image is displayed in one direction in order from the region of interest. The left figure schematically illustrates a display image by the display array unit 200 (refer to FIG. 2), and the right figure illustrates a horizontal synchronization signal Vsync, a mask signal Mask0, an image A1F, and an image A2F, similarly to FIG. 7. As illustrated in FIG. 10, the output unit 305 sequentially outputs the first selection signals corresponding to the gate lines in the first area y200a from a top to a bottom, and then sequentially outputs the second selection signals from the top to the bottom.

Thus, in the second mode, for example, the image is displayed in one direction from the region of interest in the display array unit 200 (refer to FIG. 2). By displaying the image data in order from the region of interest, the region of interest can be observed first. Furthermore, because a time for displaying outside the region of interest can be shortened by the mask signal, more time can be used for displaying the region of interest. Furthermore, because, in the second mode, an image of the region of interest is displayed in one direction, a required field of view of an observer can be narrowed.

Figure 11:
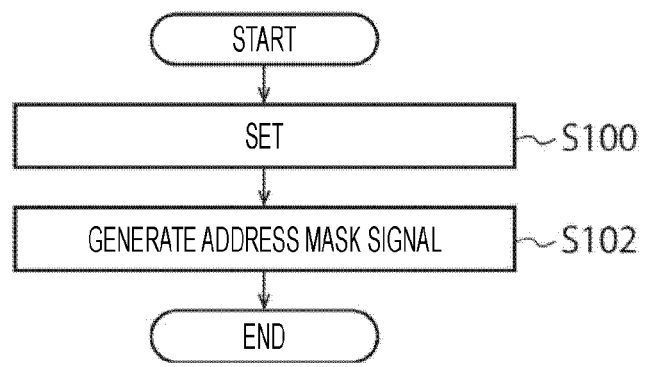
FIG. 11 is a flowchart illustrating an example of control processing by the display control device.

FIG. 11 is a flowchart illustrating an example of control processing by the display control device 30. As illustrated in FIG. 11, the setting unit 302 sets rows and start row corresponding to the region of interest in the display array unit 200 (refer to FIG. 2), and a region of which resolution in the vertical direction is set to low resolution (Step S100).

The setting unit 302 sets, for example, control information schematically illustrated in the image A1F and image A2F illustrated in FIGS. 8 to 10.

Next, according to the control information set by the setting unit 302, the address counter 304 generates selection signals with address signals and a mask signal according to the internal clock, and outputs the selection signals to the display device 20 via the output unit 305 in time series. Furthermore, the address counter 304 synchronizes, from the storage unit 300, data on the row corresponding to the address signals and mask signal with the address signals and the mask signal, and outputs the synchronized data as the video signal LDSig to the display device 20 via the output unit 305 (Step S102).

Note that the display system 1 can be used for a computer system, a navigation system, a DVD player, a Blu-ray player, a home theater system, a mobile device system, a wearable device system, a virtual/augmented reality system, or the like. Furthermore, the imaging device 10, the display device 20, and the display control device 30 that constitute the display system 1 may be integrally configured as one electronic device, such as a smartphone for example.

As described above, according to the present embodiment, the address decoder 204a is configured in the gate driver 204. With this arrangement, the display control device 30 outputs, to the address decoder 204a, the address signals in order from the address signals corresponding to the row of the region of interest in the image, by which the row data can be displayed on the display control device 30 in order from the row data of the region of interest in the image. Furthermore, the display control device 30 generates a second selection signal that selects, from among the plurality of gate lines y0 to ym, a plurality of gate lines and outputs the second selection signal to the display device 20. This enables the address decoder 204a to generate, on the basis of the address signals and mask signal included in the second selection signal, information for selecting, from among the plurality of gate lines y0 to ym, a plurality of gate lines, and the gate driver 204 to select, from among the plurality of gate lines y0 to ym, a plurality of gate lines. Thus, according to the present embodiment, the image data of the display device 20 can be displayed in order from the region of interest, and a display time for outside the region of interest of the image data can be shortened.

Second Embodiment

A display system 1 according to a second embodiment is different from the display system 1 according to the first embodiment in further including a recognition processing unit capable of automatically recognizing a region of interest. Hereinafter, differences from the display system 1 according to the first embodiment will be described.

Figure 12:
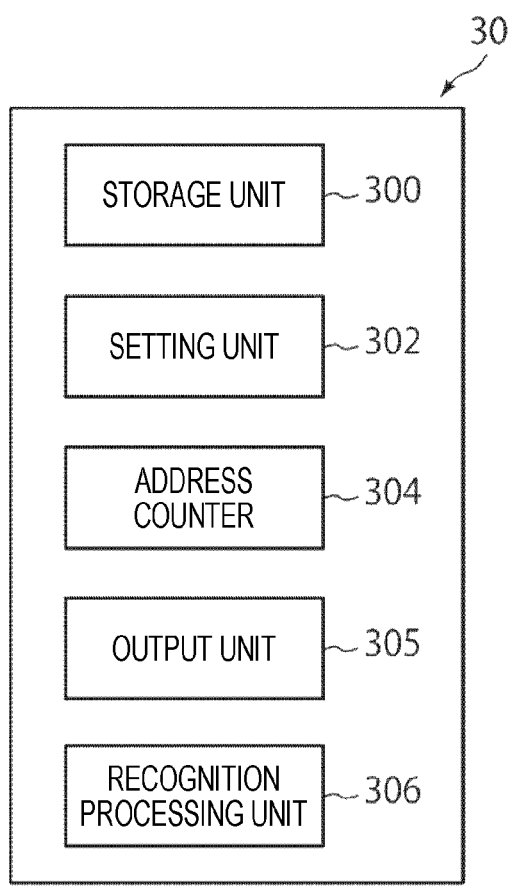
FIG. 12 is a block diagram illustrating a configuration of a display control device according to a second embodiment.

FIG. 12 is a block diagram illustrating a configuration of a display control device 30 according to the second embodiment. As illustrated in FIG. 12, the display control device 30 according to the second embodiment further includes a recognition processing unit 306.

The recognition processing unit 306 recognizes the region of interest in image data. For example, the recognition processing unit 306 includes a first recognition algorithm for recognizing a moving object in an image, a second algorithm for performing facial recognition, a third algorithm for performing an eye region in a face, and the like. The recognition processing unit 306 switches the algorithms depending on a mode in which the display system 1 is used. For example, in an automated driving system, a car, a person, and the like are recognized as the region of interest by using the first recognition algorithm. Furthermore, in a monitoring system, a face of a person is recognized as the region of interest by using the second algorithm. Moreover, a sleep monitoring system recognizes an eye region as the region of interest by using the third algorithm.

Figure 13:
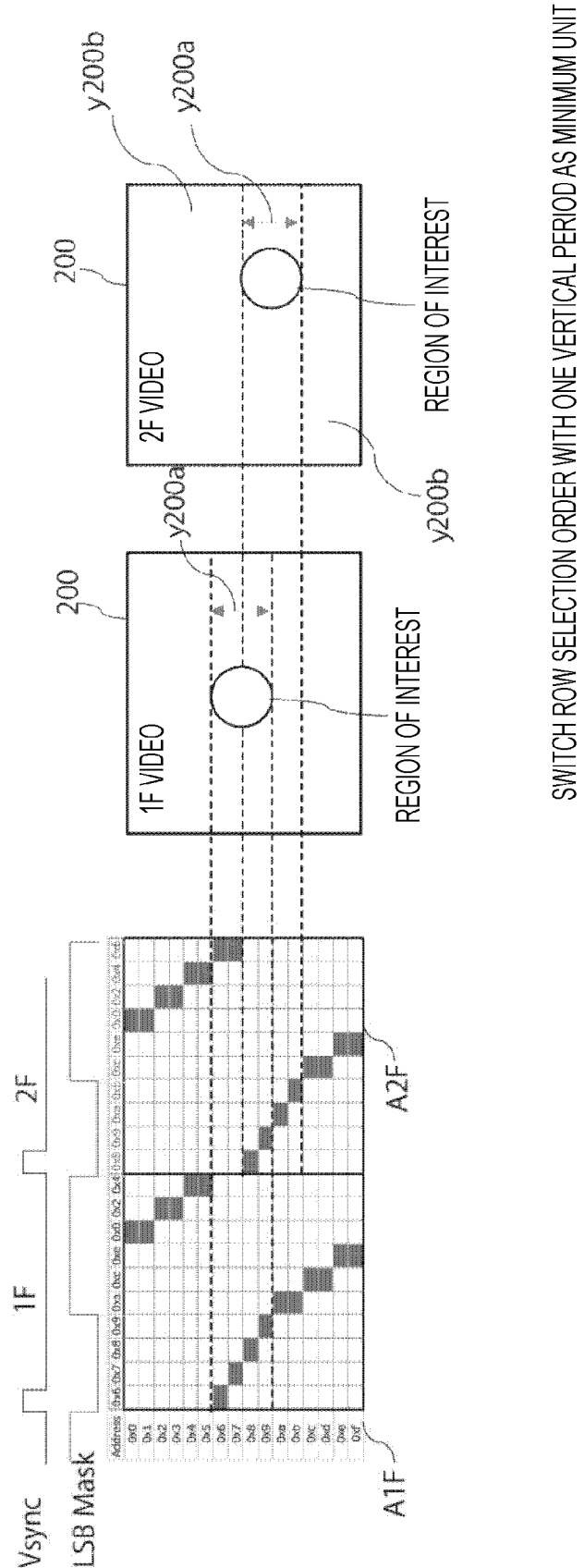
FIG. 13 is a diagram illustrating an example of control information set by a setting unit on the basis of a recognized region of interest.

FIG. 13 is a diagram illustrating an example of control information set by a setting unit 302 on the basis of the region of interest recognized by the recognition processing unit 306. The right figure is a diagram illustrating the region of interest recognized by the recognition processing unit 306 from inside a first frame image 1F and a second frame image 2F. The left figure illustrates a horizontal synchronization signal Vsync, mask signal Mask0, image A1F, and image A2F based on a result of recognition processing. Here, an example of a second mode will be described.

As illustrated in FIG. 13, the setting unit 302 sets a first area y200a corresponding to the region of interest in the first frame image 1F and second frame image 2F as a region of interest, and sets an upper end of the region of interest as a start row. Furthermore, the setting unit 302 sets a second area y200b in which a vertical resolution is set to a low resolution. That is, selection signals corresponding to gate lines, among a plurality of gate lines, in the first area y200a are first selection signals that select one row, and selection signals corresponding to gate lines in the second area y200b different from the first area y200a are second selection signals that select a plurality of rows.

As described above, according to the present embodiment, a display device 20 is controlled according to the control information set by the setting unit 302 on the basis of the region of interest recognized by the recognition processing unit 306. With this arrangement, the image data can be displayed in order from the region of interest even if the region of interest moves, and therefore the region of interest can be observed first. Furthermore, because a time for displaying outside the region of interest can be shortened by the mask signal, more time can be used for display of the region of interest.

Third Embodiment

A display system 1 according to a third embodiment is different from the display system 1 according to the second embodiment in having a control mode in which all pixels 200a in a display device 20 are caused to emit light. Hereinafter, differences from the display system 1 according to the second embodiment will be described.

Figure 14:
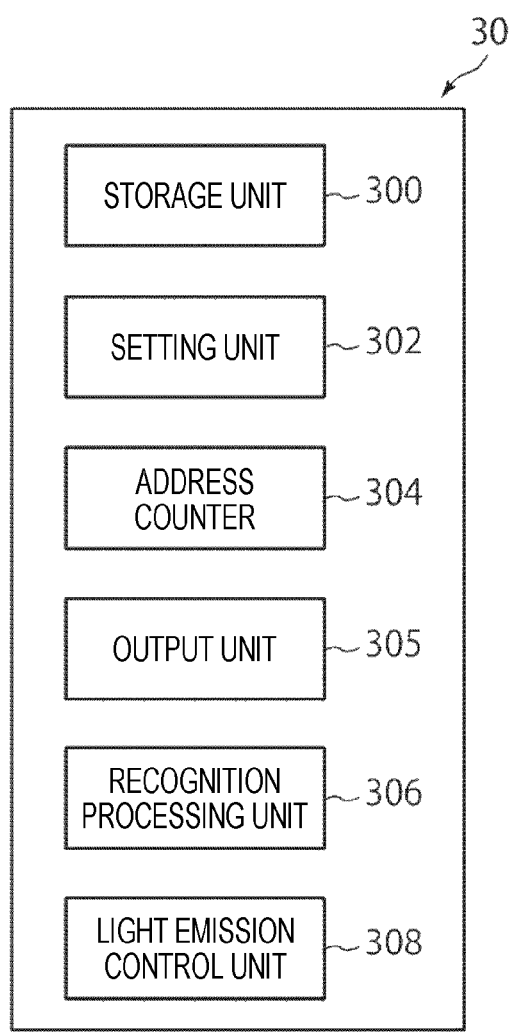
FIG. 14 is a block diagram illustrating a configuration of a display control device according to a third embodiment.

FIG. 14 is a block diagram illustrating a configuration of a display control device 30 according to the third embodiment. As illustrated in FIG. 13, the display control device 30 according to the third embodiment further includes a light emission control unit 308.

The light emission control unit 308 can perform control to apply a voltage φ to all rows of all gate lines y0 to ym of a vertical buffer 204b (refer to FIG. 2) and output a high-luminance video signal from all lines of a source driver 202.

Figure 15:
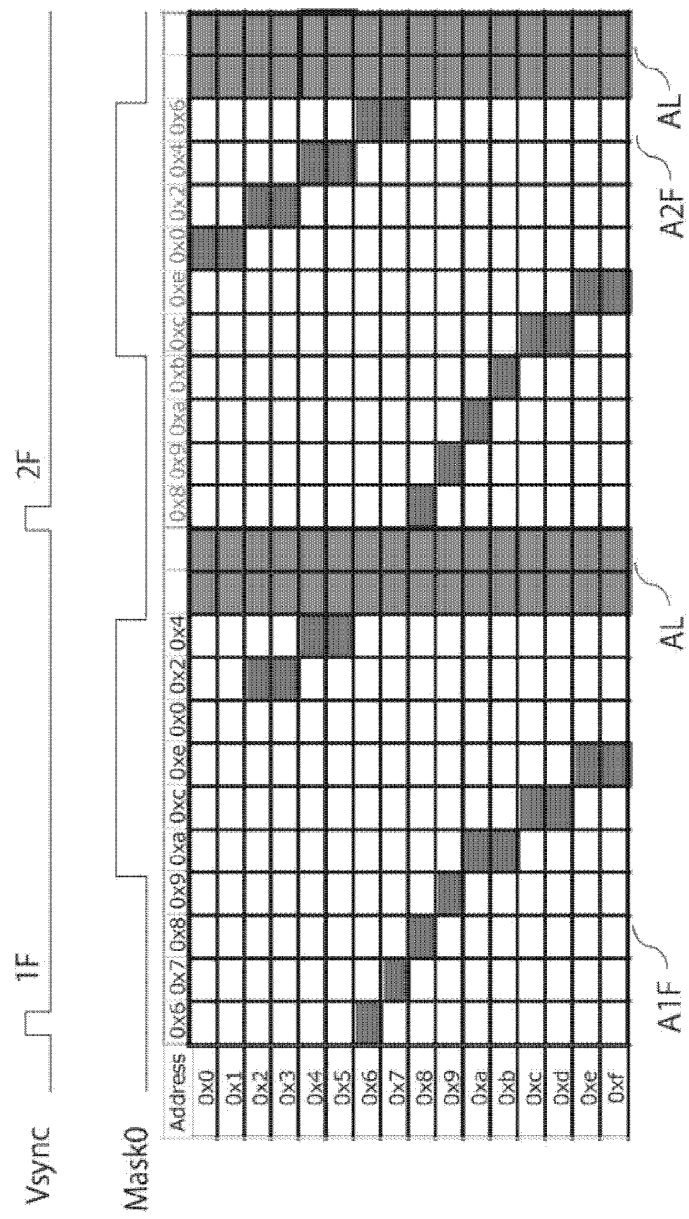
FIG. 15 is a diagram illustrating an example of information set by a setting unit.

FIG. 15 is a diagram illustrating a horizontal synchronization signal Vsync, a mask signal Mask0, an image A1F, and an image A2F set by a setting unit 302. A region AL indicates a control period during which the light emission control unit 308 causes all the pixels 200a in the display device 20 to emit light.

As described above, according to the present embodiment, there is provided a control period during which all the pixels 200a in the display device 20 are caused to emit light according to light emission control by the light emission control unit 308 at an end of display of a frame image. With this arrangement, a light emission cycle of the pixels is reset, and flicker is less likely to occur.

Fourth Embodiment

A display system 1 according to a fourth embodiment is different from the display system 1 according to the third embodiment in which an address decoder 204a of a display device 20 further includes a mode in which light is emitted on four rows simultaneously. Hereinafter, differences from the display system 1 according to the second embodiment will be described.

Figure 16:
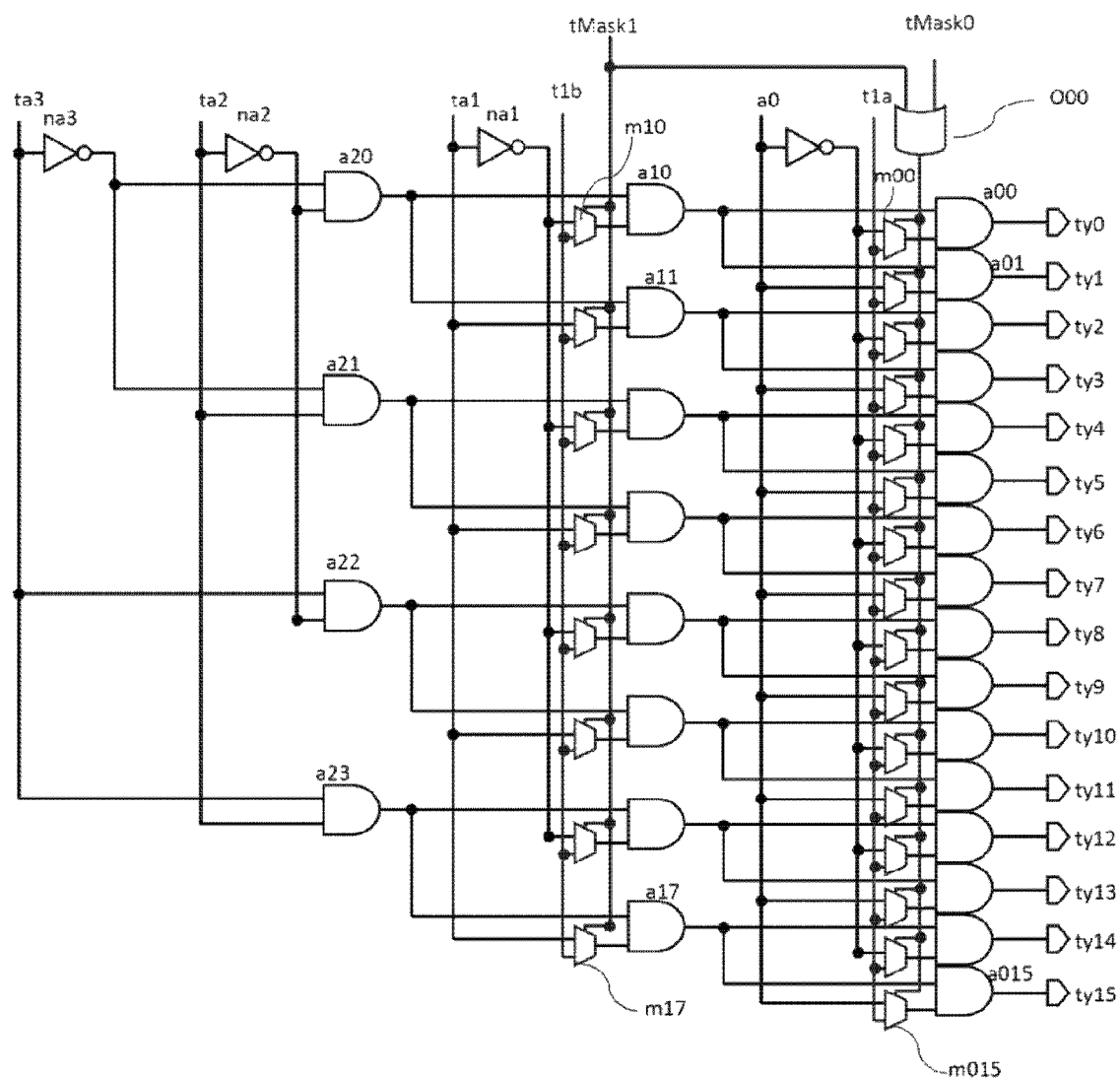
FIG. 16 is a block diagram illustrating an example of a configuration of an address decoder according to a fourth embodiment.

Here, examples of configuration and operation of the address decoder 204a according to the fourth embodiment will be described with reference to FIGS. 16 and 17. FIG. 16 is a block diagram illustrating an example of a configuration of the address decoder 204a according to the fourth embodiment. As illustrated in FIG. 16, the address decoder is different from the address decoder 204a according to the first embodiment in further including a tMask1 terminal, a t1b terminal, a plurality of multiplexers m10 to m17, and an OR gate O00.

As illustrated in FIG. 16, the address decoder 204a includes a plurality of NOT gates na0 to na3, a plurality of AND gates a20 to a23, a20 to a23, a10 to a17, and a00 to a015, and a plurality of multiplexers m10 to m17, input terminals ta0 to ta3, t1, tMask0, and output terminals ty0 to ty15. Note that 16 output terminals ty0 to ty15 are described to simplify the description, but the present invention is not limited thereto. For example, the number of the output terminals may be expanded to m.

A terminal ta1 is connected to one input terminal of each of the multiplexers m11, 13, 15, and 17 that are even-numbered multiplexers from a top among the multiplexers m10 to m17. An output terminal of a NOT gate na2 is connected to one input terminal of each of the multiplexers m10, 12, 14, and 16 that are odd-numbered multiplexers from the top among the multiplexers m10 to m17. Furthermore, a terminal t1b is connected to another input terminal of each of the multiplexers m10 to m17. Furthermore, the terminal tMask1 is connected to a control terminal of each of the multiplexers m10 to m17. Then, an output terminal of each of the multiplexers m10 to m17 is connected to one input terminal of each of AND gates a10 to a17, respectively.

The terminal tMask1 is connected to one input terminal of the OR gate O00, and the terminal tMask0 is connected to another input terminal of the OR gate O00. Then, an output terminal of the terminal tMask1 is connected to each of control terminals of the multiplexers m00 to m015.

FIG. 17 is a diagram illustrating an example of a truth table of the address decoder 204a according to the fourth embodiment. Bit data a3, a2, a1, and a0 in a field 210 are examples of address signals, a Mask0 is an example of a mask signal of a low-order bit, and a Mask1 is an example of a mask signal of a high-order bit.

In a case where the mask signal Mask1 is (1), the address decoder 204a outputs a signal without depending on values of the address signals a0 and a1. For example, in a case where the mask signal Mask0 is (1), the address signals a3, a2, a1, and a0 are (0, 0, x, x), and (1, 1, 1, 1, 0 . . . 0) is output to the output terminals ty0 to ty15. Here, "x" means not depending on a signal value x. For example, in a case where the mask signal Mask0 is (1), the address signals a3, a2, a1, and a0 are (0, 1, x, x), and (0, 0, 0, 0, 1, 1, 1, 1, 0 . . . 0) is output to the output terminals ty0 to ty15. Thus, in a case where the mask signal Mask1 is (1), 1 is output to four consecutive terminals among the output terminals ty0 to ty15.

Figure 18:
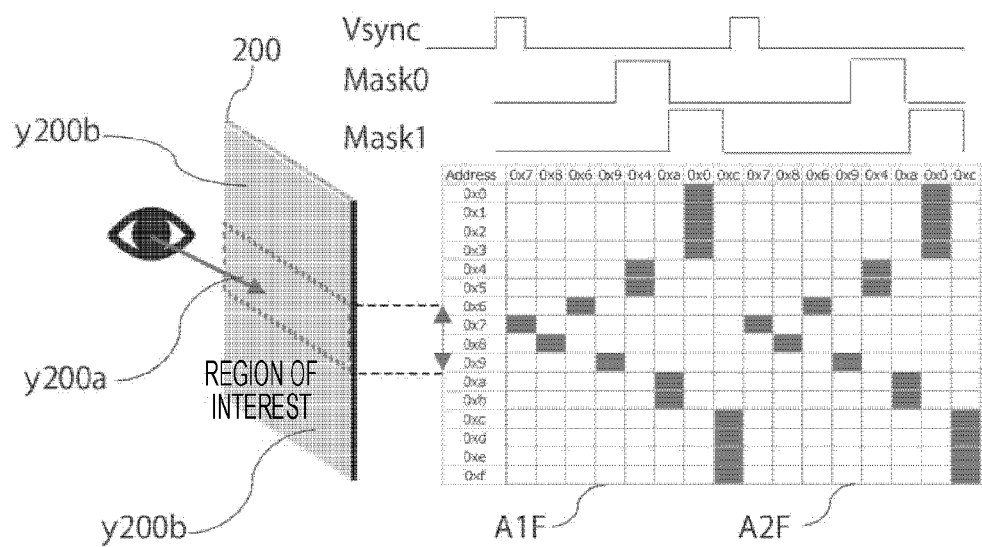
FIG. 18 is a diagram illustrating an example of a first mode in a case where there is a period during which a mask signal Mask1 is in a high-level state.

FIG. 18 is a diagram illustrating an example of a first mode in a case where there is a period during which the mask signal Mask1 is in a high-level state. The left figure schematically illustrates a display image by the display array unit 200 (refer to FIG. 2), and the right figure illustrates a horizontal synchronization signal Vsync, a mask signal Mask0, a mask signal Mask1, an image A1F, and an image A2F, similarly to FIG. 7. In the first mode, for example, an image is displayed in an upper direction and a lower direction alternately with respect to a region of interest in the display array unit 200 (refer to FIG. 2), and when the mask signal Mask0 is at a high level (for example, 1), two rows are simultaneously driven. Furthermore, when the mask signal Mask1 is at the high level (for example, 1), four rows are simultaneously driven. With this arrangement, a vertical resolution can be changed in stages. Because a time for displaying outside the region of interest can be shortened by the mask signal Mask0 and the mask signal Mask1, more time can be used for display of the region of interest. Furthermore, by simultaneously driving four rows with the mask signal Mask1, a time for displaying a piece of image data can be shortened.

Figure 19:
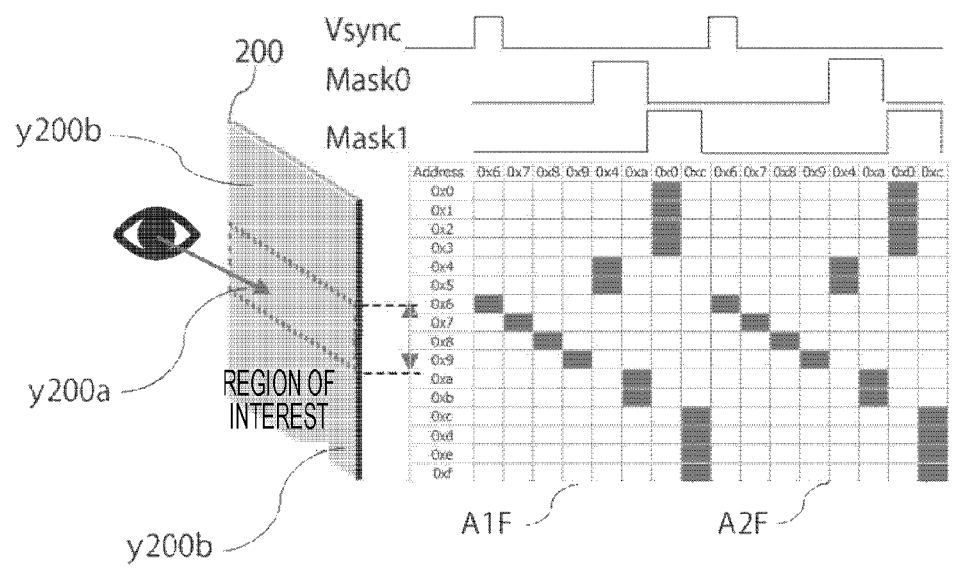
FIG. 19 is a diagram illustrating an example of a third mode in a case where there is a period during which a mask signal Mask1 is in a high-level state.

FIG. 19 is a diagram illustrating an example of a third mode in a case where there is a period during which the mask signal Mask1 is in a high-level state. The left figure schematically illustrates a display image by the display array unit 200 (refer to FIG. 2), and the right figure illustrates a horizontal synchronization signal Vsync, a mask signal Mask0, a mask signal Mask1, an image A1F, and an image A2F, similarly to FIG. 7. In the third mode, for example, an image is displayed in one direction in the region of interest in the display array unit 200 (refer to FIG. 2), and the image is displayed in the upper direction and the lower direction alternately. Because the image is displayed in one direction in the region of interest, a required field of view can be narrowed. Furthermore, when the mask signal Mask0 is at the high level (for example, 1), two rows are simultaneously driven. Furthermore, when the mask signal Mask1 is at the high level (for example, 1), four rows are simultaneously driven. With this arrangement, a vertical resolution can be changed in stages. Because a time for displaying outside the region of interest can be shortened by the mask signal Mask0 and the mask signal Mask1, more time can be used for display of the region of interest.

As described above, according to the present embodiment, the vertical resolution can be changed in stages by the mask signal Mask0 and the mask signal Mask1. With this arrangement, the vertical resolution can be lowered in stages as a distance from the region of interest increases. Therefore, a time for displaying outside the region of interest can be shortened, and therefore more time can be used for display of the region of interest. Furthermore, by lowering a resolution of the region of interest in stages, it is possible to guide a line of sight of an observer in a direction in which the resolution increases, and thus to guide the line of sight of the observer to the region of interest.

[Head-Mounted Display]

Figure 20:
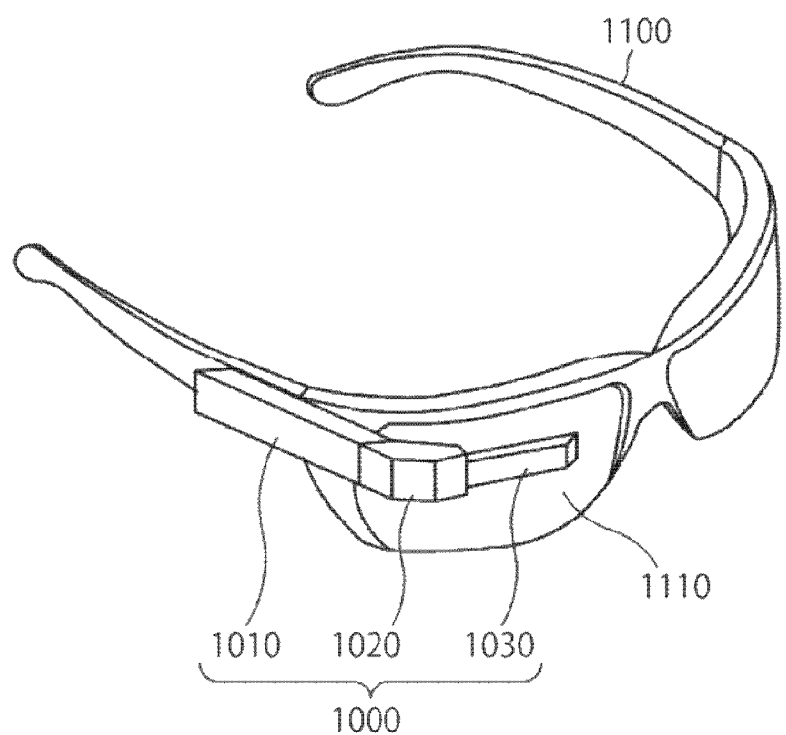
FIG. 20 is an external view illustrating an example of a head-mounted display according to a specific example of an electronic device according to the present disclosure.

FIG. 20 is an external view illustrating an example of a head-mounted display according to a specific example of an electronic device of the present disclosure.

A head-mounted display 1000 has a transmissive head-mounted display configuration including a main body unit 1010, an arm 1020, and a lens barrel 1030. The main body unit 1010 is connected to the arm 1020 and glasses 1100. Specifically, an end of the main body unit 1010 in a long side direction is attached to the arm 1020. Furthermore, one side of a side surface of the main body unit 1010 is connected to the glasses 1100 via a connection member (not illustrated). Note that, the main body unit 1010 may be directly mounted on a head of a human body.

The main body unit 1010 incorporates a control substrate for controlling operation of the head-mounted display 1000, and a display unit. That is, the display device 20 according to the present embodiment corresponds to the display unit, and a display control device 30 corresponds to at least some region of the control substrate.

The arm 1020 supports the lens barrel 1030 with respect to the main body unit 1010 by connecting the main body unit 1010 to the lens barrel 1030. Specifically, the arm 1020 is connected to the end of the main body unit 1010 and an end of the lens barrel 1030 to fix the lens barrel 1030 with respect to the main body unit 1010. Furthermore, the arm 1020 incorporates a signal line for communicating data related to an image provided from the main body unit 1010 to the lens barrel 1030.

The lens barrel 1030 projects image light provided from the main body unit 1010 via the arm 1020 toward an eye of a user wearing the head-mounted display 1000 through a lens 1110 of the glasses 1100.

Note that the present technology can have configurations as follows.

(1) A display control device that controls a display device including at least a display array unit including a plurality of gate lines and a plurality of data lines that are disposed in a screen, and a plurality of light-emitting elements that is disposed at each of intersections of the gate lines and the data lines, and is selectively driven via the gate lines and the data lines, and a first drive circuit including a conversion unit capable of generating information for selecting, from among the plurality of gate lines, a plurality of gate lines on the basis of a selection signal that selects a row, the first drive circuit selecting, from among the plurality of gate lines, one or a plurality of gate lines on the basis of the information, the display control device including a signal generation unit that generates the selection signal that selects, from among the plurality of gate lines, a plurality of gate lines, and an output unit that outputs the selection signal.

(2) The display control device according to (1), in which the signal generation unit generates each of the selection signals corresponding to gate lines selected within one vertical period of the display array unit, and the output unit outputs the each the selection signals in time series.

(3) The display control device according to (2), in which the output unit outputs the selection signals in order from a selection signal corresponding to a predetermined gate line.

(4) The display control device according to (3), in which the predetermined gate line corresponds to an inside of a region of interest in an image.

(5) The display control device according to (4), in which, after outputting the selection signal corresponding to a predetermined gate line, the output unit alternately outputs selection signals corresponding to gate lines positioned above and below the predetermined gate line.

(6) The display control device according to (1), in which the selection signal corresponding to a gate line in a first area, among the plurality of gate lines, is a first selection signal that selects one row, and the selection signals corresponding to gate lines in a second area different from the first area are second selection signals that select a plurality of rows.

(7) The display control device according to (6), in which, after outputting the first selection signal corresponding to a sequence of the predetermined gate line, the output unit alternately outputs the second selection signals corresponding to the gate lines positioned at an upper section and lower section of the second area.

(8) The display control device according to (7), in which the output unit outputs the second selection signals after outputting the first selection signal.

(9) The display control device according to any one of (5) to (8), the display control device further including
  a storage unit that stores image data, and
  a recognition processing unit that recognizes a predetermined recognition region from the image data,
  in which the signal generation unit generates the first selection signal on the basis of the predetermined recognition region.

(10) The display control device according to (9),
  in which the display device further includes a second drive circuit that sequentially selects the plurality of data lines and supplies a video signal, and
  the output unit outputs the video signal on the basis of the image data.

(11) The display control device according to (10), the display control device further including
  a light emission control unit that causes the first drive circuit to select a plurality of gate lines disposed in the screen, and causes high-luminance signals to be output from the plurality of data lines in the second drive circuit.

(12) The display control device according to any one of (1) to (11),
  in which the selection signal includes an address signal corresponding to a gate line selected from the plurality of gate lines, and
  the conversion unit converts, on the basis of the address signal, into information for selecting, from among the plurality of gate lines, one or a plurality of gate lines.

(13) The display control device according to (12),
  in which the address signal includes a high-order address signal and a low-order address signal, and, in a case where, from among the plurality of gate lines, a plurality of gate lines is selected, the first drive circuit selects the plurality of gate lines on the basis of the high-order address signal.

(14) The display control device according to (13),
  in which the selection signal includes a mask signal indicating that the low-order address signal is not to be used, and
  the first drive circuit selects, from among the plurality of gate lines, a plurality of gate lines on the basis of the mask signal.

(15) A display device including
  a display array unit including a plurality of gate lines and a plurality of data lines that are disposed in a screen, and a plurality of light-emitting elements that is disposed at each of intersections of the gate lines and the data lines, and is selectively driven via the gate lines and the data lines,
  a first drive circuit including an address decoder capable of generating information for selecting, from among the plurality of gate lines, a plurality of gate lines on the basis of an address signal that selects a row, the first drive circuit selecting, from among the plurality of gate lines, one or a plurality of gate lines on the basis of the information, and
  a second drive circuit that sequentially selects the plurality of data lines and supplies a video signal.

(16) The display device according to (15),
  in which the address signal includes a high-order address signal and a low-order address signal, and, in a case where, from among the plurality of gate lines, a plurality of gate lines is selected, the first drive circuit selects the plurality of gate lines on the basis of the high-order address signal.

(17) The display device according to (16),
  in which the first drive circuit selects, from the plurality of gate lines, a plurality of gate lines according to a mask signal indicating that the low-order address signal is not to be used.

(18) A display control method for controlling a display device including at least a display array unit including a plurality of gate lines and a plurality of data lines that are disposed in a screen, and a plurality of light-emitting elements that is disposed at each of intersections of the gate lines and the data lines, and is selectively driven via the gate lines and the data lines, and
  a first drive circuit including a conversion unit capable of generating information for selecting, from among the plurality of gate lines, a plurality of gate lines on the basis of a selection signal that selects a row, the first drive circuit selecting, from among the plurality of gate lines, one or a plurality of gate lines on the basis of the information,
  the display control method including
  a signal generation step of generating the selection signal that selects, from among the plurality of gate lines, a plurality of gate lines, and
  an output step of outputting the selection signal.

Aspects of the present disclosure are not limited to the above-described individual embodiments, but include various modifications that can be conceived by those skilled in the art, and the effects of the present disclosure are not limited to the above-described contents. That is, various additions, modifications, and partial deletions can be made without departing from the conceptual idea and spirit of the present disclosure derived from the contents defined in the claims and equivalents thereof.

REFERENCE SIGNS LIST

20 Display device
30 Display control device
200 Display array unit
202 Source driver
204 Gate driver
204a Address decoder
300 Storage unit
304 Address counter
305 Output unit
306 Recognition processing unit

The invention claimed is:
1. A display system, comprises:
a display control device; and
a display device including:
  a display array circuit including:
    a plurality of gate lines and a plurality of data lines, and
    a plurality of light-emitting elements at each of a plurality of intersections of the plurality of gate lines and the plurality of data lines, wherein the plurality of gate lines and the plurality of data lines are configured to drive the plurality of light-emitting elements; and a first drive circuit configured to:
receive a plurality of selection signals from the display control device, wherein each of the plurality of selection signals comprises a mask signal and an address signal; and
a select at least one gate line from the plurality of gate lines based on the address signal, the mask signal, and at least one selection signal of the plurality of selection signals, wherein
the display control device is configured to:
generate the plurality of selection signals based on control information, wherein the control information is associated with a vertical resolution of the plurality of gate lines; and
output the plurality of selection signals.

2. The display system according to claim 1, wherein the display control device is further configured to output each of the plurality of selection signals in a time series.

3. The display system according to claim 2, wherein the display control device is further configured to output the plurality of selection signals in a specific order based on a specific gate line of the plurality of gate lines.

4. The display system according to claim 3, wherein the specific gate line corresponds to a region of interest in an image.

5. The display system according to claim 4, wherein the display control device is further configured to alternately output the plurality of selection signals corresponding to the plurality of gate lines above and below the specific gate line.

6. The display system according to claim 1, wherein the display control device is further configured to:
select a first gate line from the plurality of gate lines based on a first set of selection signals of the plurality of selection signals; and
select a first set of gate lines from the plurality of gate lines based on a second set of selection signals of the plurality of selection signals,
the first gate line is associated with a first area in an image,
the first set of gate lines is associated with a second area in the image, and
the second area is different from the first area.

7. The display system according to claim 6, wherein the display control device is further configured to output the second set of selection signals in an alternate order, and
the alternate order corresponds to a first position at an upper section of the second area and a second position at a lower section of the second area.

8. The display system according to claim 7, wherein the display control device is further configured to:
output the first set of selection signals; and
output the second set of selection signals after the first set of selection signals are outputted.

9. The display system according to claim 7, wherein the display control device is further configured to:
store image data;
recognize a specific recognition region from the image data; and
generate the first set of selection signals based on the specific recognition region.

10. The display system according to claim 9, wherein the display device further includes a second drive circuit, the second drive circuit is configured to:
sequentially select the plurality of data lines; and
transmit a video signal, and
the display control device is further configured to output the video signal based on the image data.

11. The display system according to claim 10, wherein the display control device is further configured to:
select a second set of gate lines from the plurality of gate lines, and
output a plurality of high-luminance signals from the plurality of data lines in the second drive circuit.

12. The display system according to claim 1, wherein
the address signal corresponds to the selected at least one gate line,
the first drive circuit is further configured to convert the at least one gate line into specific information based on the address signal, and
the specific information is associated with the selection of the at least one gate line of the plurality of gate lines.

13. The display system according to claim 12, wherein
the address signal includes a high-order address signal and a low-order address signal, and
the first drive circuit is further configured to select a set of gate lines from the plurality of gate lines based on the high-order address signal.

14. The display system according to claim 13, wherein
the mask signal indicates that the low-order address signal is not to be used, and
the first drive circuit is further configured to select the set of gate lines from the plurality of gate lines based on the mask signal.

15. A display device, comprising:
a display array circuit including;
a plurality of gate lines and a plurality of data lines, and
a plurality of light-emitting elements at each of a plurality of intersections of the plurality of gate lines and the plurality of data lines, wherein the plurality of gate lines and the plurality of data lines are configured to drive the plurality of light-emitting elements; and
a first drive circuit configured to:
receive a plurality of selection signals from a display control device, wherein
generation of the plurality of selection signals is based on control information,
the control information is associated with a vertical resolution of the plurality of gate lines, and
each of the plurality of selection signals comprises a mask signal and an address signal; and
select at least one gate line from the plurality of gate lines based on the address signal, the mask signal, and at least one selection signal of the plurality of selection signals; and
a second drive circuit configured to:
sequentially select the plurality of data lines; and
transmit a video signal.

16. The display device according to claim 15, wherein
the address signal includes a high-order address signal and a low-order address signal, and
the first drive circuit is further configured to select a set of gate lines from the plurality of gate lines based on the high-order address signal.

17. The display device according to claim 16, wherein
the first drive circuit is further configured to select the set of gate lines from the plurality of gate lines based on the mask signal, and
the mask signal indicates that the low-order address signal is not to be used.

18. A display method, comprising:
generating a selection signal based on control information, wherein the selection signal comprises a mask signal and an address signal;
outputting the selection signal to a display device, wherein
- the display device comprises a plurality of gate lines and a plurality of data lines, and
- the control information is associated with a vertical resolution of the plurality of gate lines; and selecting at least one gate line from the plurality of gate lines based on the address signal, the mask signal, and the selection signal.

\* \* \* \* \*